United States Patent
Schnell et al.

(10) Patent No.: US 10,852,783 B2
(45) Date of Patent: *Dec. 1, 2020

(54) RELATIVE HEIGHT ADJUSTABLE CONNECTOR SYSTEM FOR MOTHERBOARD TO GRAPHICS BOARD TRANSITION WITH A PLATING ALTERNATIVE IN INFORMATION HANDLING SYSTEMS

(71) Applicant: Dell Products, LP, Round Rock, TX (US)

(72) Inventors: Arnold Thomas Schnell, Hutto, TX (US); Ivan Guerra, Round Rock, TX (US); Gurpreet Sahota, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/951,115

(22) Filed: Apr. 11, 2018

(65) Prior Publication Data
US 2019/0317566 A1    Oct. 17, 2019

(51) Int. Cl.
*G06F 1/18* (2006.01)
*H05K 1/14* (2006.01)

(52) U.S. Cl.
CPC .............. *G06F 1/184* (2013.01); *G06F 1/185* (2013.01); *H05K 1/14* (2013.01); *H05K 1/141* (2013.01); *H05K 2201/10378* (2013.01)

(58) Field of Classification Search
CPC ........ G06F 1/184; G06F 1/185; H01R 12/523; H01R 12/00; H01R 12/721; H05K 1/14; H05K 2201/10378; H05K 1/141; H05K 3/20
See application file for complete search history.

(56) References Cited

U.S. PATENT DOCUMENTS

| 5,263,868 | A | | 11/1993 | Renn |
| 5,336,095 | A | | 8/1994 | Walburn |
| 5,428,190 | A | * | 6/1995 | Stopperan .............. H05K 3/323 174/250 |
| 5,456,608 | A | | 10/1995 | Rogers |
| 5,764,934 | A | | 6/1998 | Fisch |

(Continued)

*Primary Examiner* — James Wu
(74) *Attorney, Agent, or Firm* — Prol Intellectual Property Law, PLLC; H. Kenneth Prol

(57) ABSTRACT

A system and method of operatively coupling a motherboard and a graphics board supported on a chassis, coating the motherboard and the graphics board with an anti-tarnish finish, plating a first interposer on at least a first side with a neutral metal material, soldering pass-through electrical contacts of the first interposer to a connector pad area of the motherboard, and clamping a first compression jumper pad to compress an array of compressible communication contacts to the pass-through electrical contacts on the first interposer, adjusting a flexible jumper trace array cable between the first compression jumper pad and a second compression jumper pad to adjacently align the motherboard and graphics board to minimize thickness of the information handling system, and coupling the second compression jumper pad to the graphics board to provide lanes of data communication.

20 Claims, 9 Drawing Sheets

(56) References Cited

U.S. PATENT DOCUMENTS

| | | | |
|---|---|---|---|
| 5,948,087 A * | 9/1999 | Khan | G06F 1/184 |
| | | | 710/301 |
| 5,971,806 A | 10/1999 | Evans | |
| 6,035,356 A * | 3/2000 | Khan | G06F 1/184 |
| | | | 361/796 |
| 6,042,412 A | 3/2000 | Murr | |
| 6,074,220 A | 6/2000 | Roberts | |
| 6,331,939 B1 | 12/2001 | Corisis | |
| 7,438,581 B1 | 10/2008 | Jeon | |
| 7,442,204 B2 | 10/2008 | Schwammenthal | |
| 10,254,793 B1 * | 4/2019 | Schnell | G06F 1/1633 |
| 2002/0148636 A1 * | 10/2002 | Belke | H05K 1/117 |
| | | | 174/254 |
| 2010/0307798 A1 | 12/2010 | Izadian | |
| 2014/0104776 A1 | 4/2014 | Clayton | |
| 2016/0227652 A1 * | 8/2016 | Clayton | H05K 3/363 |

* cited by examiner

RELATIVE HEIGHT ADJUSTABLE CONNECTOR SYSTEM FOR MOTHERBOARD TO GRAPHICS BOARD TRANSITION WITH A PLATING ALTERNATIVE IN INFORMATION HANDLING SYSTEMS

FIELD OF THE DISCLOSURE

The present disclosure generally relates to a method and apparatus for connector systems for board transitions among components of an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, and networking systems. Information handling systems can also implement various virtualized architectures. Data communications among information handling systems may be via networks that are wired, wireless, optical or some combination. Further, powerful graphics system may be desirable for use with current applications even for information handling systems have limited internal space to house components or for information handling systems requiring thin profiles such as mobile information handling systems. Components within information handling systems performing various functions may need to be designed for implementation in many form factors requiring variation to maintain space efficiency. The components within information handling systems may be more cost efficient when designed to be conformable to available characteristics of several information handling system models to minimize costs of re-designing entire components or component layouts between models and further decrease design complexities.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality. The information handling system can include memory (volatile (e.g. random-access memory, etc.), non-volatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

Figure 1:
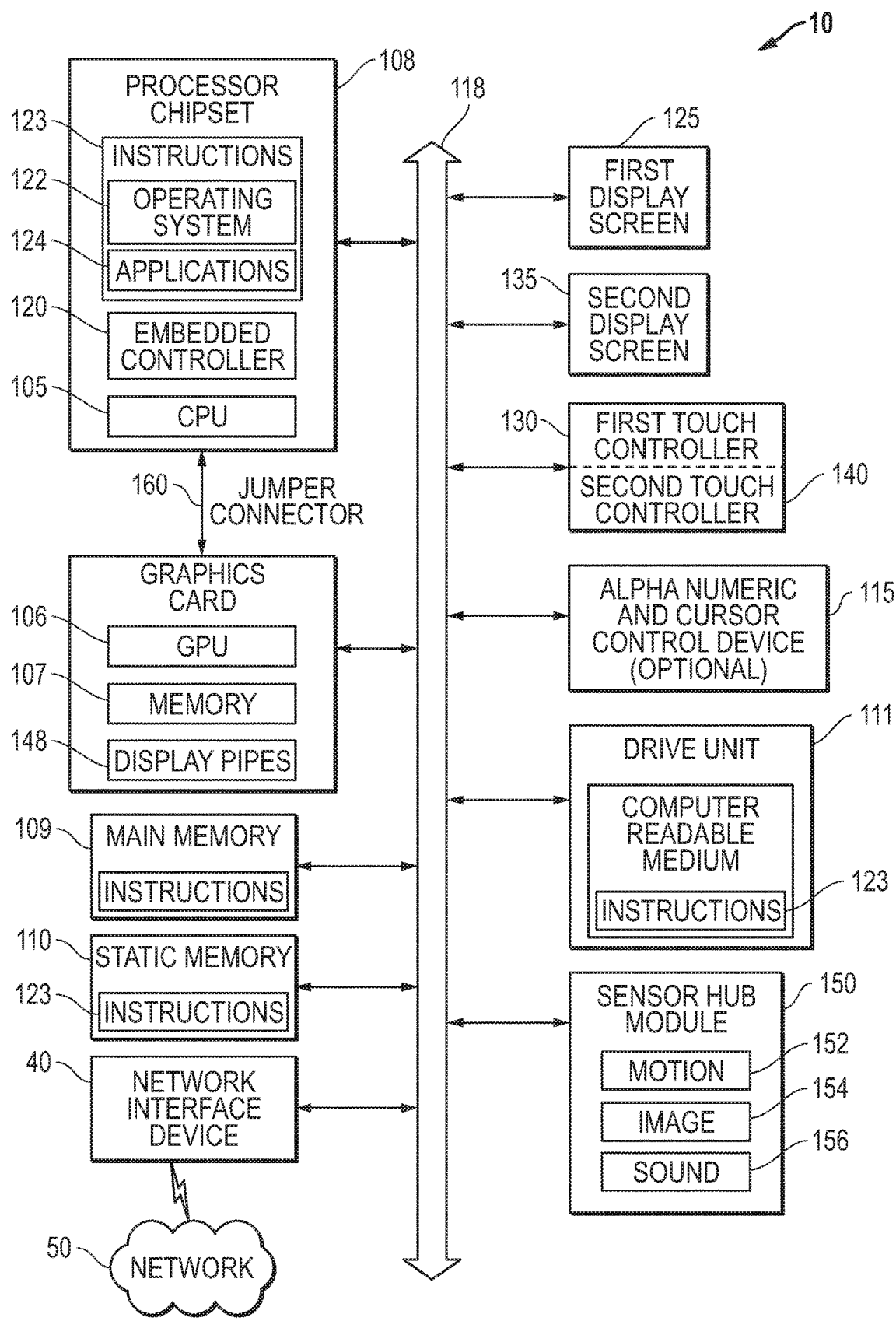
FIG. 1 is a block diagram illustrating an information handling system according to an embodiment of the present disclosure.

FIG. 1 shows an information handling system 10 capable of administering each of the specific embodiments of the present disclosure. The information handling system 10 can represent information handling systems with motherboard and graphics board arrangements shown in FIGS. 2-4 and implementation of the embodiments described in FIG. 5 and FIG. 6. Information handling system 10 may represent an information handling system such as a mobile information handling system with enhanced graphics processing capabilities. A mobile information handling system may execute instructions via a processor for a plurality of application programs and operating systems as understood. Information handling system 10 may also represent a networked server or other system. The information handling system 10 may include a processor such as a central processing unit (CPU) 105, a graphics processing unit (GPU) 106, or both. Moreover, the information handling system 10 can include a main memory 109 and a static memory 110 that can communicate with each other via a bus 118.

As shown, the information handling system 10 may further include a video display 125 and in some embodiments a second display screen 135 or more display screens. Display screens 125 or 135 may be of a variety of display devices, such as a liquid crystal display (LCD), an organic light emitting diode (OLED), a flat panel display, a solid state display, or a cathode ray tube (CRT). Display 125 or 135 may include one or more touch screen display module and touch screen controllers 130 and 140 for receiving user inputs to the information handling system 10. In the case of information handling systems with flat panel display systems including LCD or OLED displays, it is desirable to minimize a thickness of the information handling system while maximizing the power of the graphics display system to accommodate, for example, a large size of the display(s) on the surface of the information handling system. In some cases, mobile information handling systems may have very limited thickness in a chassis to accommodate the display, motherboard, and a separate graphics board for enhanced graphics processing power or performance. Thus, the thickness or "Z" dimension space may be very limited for internal components and may particularly be limited according to current systems for linking a motherboard and distinct graphics board. Additionally, multiple levels for a CPU 105 and GPU 106 may require a complex system of bends and angles when a shared heat pipe system is employed or may require two separate heat pipes for the CPU 105 and GPU 106. A heat pipe with complex bends may be less efficient and costlier to manufacture. Multiple heat pipes may increase costs of an information handling system as well. Current connectors for electrical communication connections within the chipset from CPU 105 and GPU 106 may include M×M connectors which may require a right angle connection or otherwise elevated connection and place a motherboard and graphics board at different levels which may contribute to an overall thickness of an information handling system.

According to embodiments of the disclosure, a flexible compression jumper connector 160 with a plurality of compression jumper pads having compressible communication contacts for operatively coupling to connector pad interface areas on the motherboard and graphics boards respectively. The flexible compression jumper connector 160 includes a flexible jumper trace array cable, which may be a ribbon cable connector or array of electrical traces, and which provides for an adjustable transition between levels of the compression jumper pads to link the mother board and graphics boards electrically for communication. In some embodiments, the compressible communication contacts may include an array of compressible electrical spring contacts on each compression jumper pad. In yet other embodiments, the compressible communication contacts, such as an array of compressible electrical spring contacts, may be mounted on the motherboard or graphics board facing away from the motherboard or graphics board. The compression jumper pads of a flexible compression jumper connector 160 in such an embodiment have electrical contacts that compress the compressible communication contacts mounted to the motherboard and graphics board at connector pad interface areas. The compressible communication contacts in such an embodiment may be soldered to the motherboard and graphics board respectively in some embodiments. Other mounting systems may be used to establish electrical conductivity for communications via the board connector pad interface areas and between the CPU and GPU mounted on the motherboard and graphics boards respectively in other embodiments as well.

The flexible compression jumper connector 160 includes a flexible jumper trace array cable, which may be a ribbon cable connector or array of electrical traces, and which provides for an adjustable transition between levels of the compression jumper pads to link the mother board and graphics boards electrically for communication. In some embodiments, the compressible communication contacts may include an array of compressible electrical spring contacts on each compression jumper pad. In yet other embodiments, the compressible communication contacts, such as an array of compressible electrical spring contacts, may be mounted on the motherboard or graphics board facing away from the motherboard or graphics board as described.

Due to the material metal or metal alloy used with a flexible compression jumper connector 160 having compression jumper pads with compressible communication contacts for operatively coupling to connector pad interface areas on the motherboard and graphics boards respectively, some issues may arise during mechanical contact and compression of the compressible communication contacts with the corresponding PCB electrical contacts of the connector pad interface areas. PCB boards are frequently required to be finished with a coating layer to avoid tarnish, damage from thermal shock or humidity of the PCB including copper exposed areas such as electrical contacts and the like. The finish use must be solderable such that the finish is eliminated by flux during the soldering process while maintaining protection of copper from oxidation when not soldered. An example finish includes Organic Solderability Preservatives (OSP) as an anti-tarnish layer applied to PCBs.

A compression electrical connection however may not be compatible with an OSP finished PCB board since not flux or solder is applied to create the electrical connection. Further, the OSP may cause possible chemical reaction to the metal or metal allow used with the compressible communication contacts of the flexible compression jumper connector 160. As a solution, localized plating of the electrical contacts in the connector pad interfaces may be conducted with a neutral metal interface that provides sufficient conductivity. However, localized plating at the electrical contacts of the connector pad interfaces may be an expensive or inefficient process. Often the plating includes a gold component, gold alloy, or even a silver alloy such as electroless nickel immersion gold (ENIG), gold flash, or hard gold plating. Thus, additional cost is incurred due to the extra process step in a PCB manufacturing line to accomplish the localized plating. A localized plating interposer is developed for a transition between the PCB electrical connectors in the connector pad interface areas of the motherboard and graphics board which may have an array of plated electrical connectors on one side. The localized plating interposer may be inserted between the connector pad interface to which it is soldered on the motherboard or graphics board and the compression pads of the flexible compression jumper connector 160

In various embodiments, the flexible compression jumper connector 160 allows for adjacent placement of motherboards along the graphics boards without substantial additional height or "Z" dimension occupancy of those boards to maintain a thin information handling system profile. Further, the flexible compression jumper connector 160 may accommodate channels or data lanes for various digital display data communication standards including bus architectures such as PCIe or display data interface standards such as DisplayPort (DP), or eDP. Such standards may be used for communications between the CPU 105 and GPU 105 mounted on separate cards. Additional lanes or channels of PCIe, DP, or other standard digital display data communications may be achieved with utilization of a plurality of flexible compression jumper connectors 160 between the motherboard and graphics board while maintaining the advantages of minimizing thickness and offset between levels of the CPU 105 and GPU 106.

Additionally, the information handling system 10 may include an input device 115, such as a keyboard, and a cursor control device, such as a mouse or touchpad or similar peripheral input device. The information handling system may include a power source such as battery or an A/C power source (not shown). The information handling system 10 can also include a disk drive unit 111, and a signal generation device such as a speaker or remote control or other device (not shown). The information handling system 10 can include a network interface device 40 such as a wireless adapter or similar wireless radio system to accommodate a variety of wireless communication protocols. The information handling system 10 can also represent a server device whose resources can be shared by multiple client devices, or it can represent an individual client device, such as a desktop personal computer, a laptop computer, a tablet computer, a mobile smartphone, or a wearable computing device.

The information handling system 10 can include a set of instructions 123 that can be executed to cause the computer system to perform any one or more methods or computer-based functions. Various software modules comprising application instructions 124 may be coordinated by an operating system (OS) 122 and via an application programming interface (API). An example operating system may include Windows®, Android®, and other OS types known in the art. Example APIs may include Win 32, Core Java API, or Android APIs. In a further example, processor 105 may conduct processing of sets of instructions in software, firmware, hardware or any combination of the same to achieve functions understood to be performed by the information handling system 10 according to disclosures herein. Further one or more embedded controllers 120 may also be included in the chipset, on the motherboard, or in the graphics board to provide for additional processing or execution of instructions in addition to processing conducted by the CPU 105 or GPU 106 as understood in some embodiments. The computer system 10 may operate as a standalone device or may be connected such as using a network, to other computer systems or peripheral devices.

In a networked deployment, the information handling system 10 may operate in the capacity of a server or as a client user computer in a server-client user network environment, or as a peer computer system in a peer-to-peer (or distributed) network environment. The information handling system 10 can also be implemented as or incorporated into various devices, such as a personal computer (PC), a tablet PC, a set-top box (STB), a PDA, a mobile information handling system, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 10 can be implemented using electronic devices that provide voice, video, or data communication. Further, while a single information handling system 10 is illustrated, the term "system" shall also be taken to include any collection of systems or sub-systems that individually or jointly execute a set, or multiple sets, of instructions to perform one or more computer functions.

The static memory 110 or disk drive unit 111 may include a computer-readable medium in which one or more sets of instructions 123 such as software can be embedded or stored. Similarly, main memory 109 and static memory 110 may also contain computer-readable medium for storage of one or more sets of instructions, parameters, or profiles 123. The disk drive unit 111 and static memory 110 also contains space for data storage. Further, the instructions 123 may embody one or more of the methods or logic for applications, such as 124, that operate on the information handling system to display graphical content as described herein. For example, instructions relating to the various software algorithms and data may be stored here. The instructions, parameters, and profiles 123 may reside completely, or at least partially, within the main memory 109, the static memory 110, and/or within the disk drive 111 during execution by the processor 105 of information handling system 10. As explained, some or all the software, firmware or hardware instructions may be executed locally or remotely. The main memory 109 and the processor 105 also may include computer-readable media.

The network interface device 40, such as a wireless adapter, can provide connectivity to a network 128, e.g., a wide area network (WAN), a local area network (LAN), wireless local area network (WLAN), a wireless personal area network (WPAN), a wireless wide area network (WWAN), or other network. Connectivity may be via wired or wireless connection. Wireless adapter 40 may include one or more radio frequency subsystems with transmitter/receiver circuitry, wireless controller circuitry, amplifiers and other circuitry for wireless communications. Each radio frequency subsystem may communicate with one or more wireless technology protocols. The wireless adapter 40 may also include antenna system which may be tunable antenna systems in some embodiments.

The wireless adapter 40 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. Wireless adapter 120 may connect to any combination of macro-cellular wireless connections including 2G, 2.5G, 3G, 4G, 5G or the like from one or more service providers. The wireless adapter 40 can represent an add-in card, wireless network interface module that is integrated with a main board of the information handling system or integrated with another wireless network interface capability, or any combination thereof. In an embodiment the wireless adapter 40 may include one or more radio frequency subsystems including transmitters and wireless controllers for connecting via a multitude of wireless links. The radio frequency subsystems include wireless controllers to manage authentication, connectivity, communications, power levels for transmission, buffering, error correction, baseband processing, and other functions of the wireless adapter 40. The wireless adapter 40 may also connect to the external network via a WPAN, WLAN, WWAN or similar wireless switched Ethernet connection. The wireless data communication standards set forth protocols for communications and routing via access points, as well as protocols for a variety of other operations.

In some embodiments, dedicated hardware implementations such as application specific integrated circuits, programmable logic arrays and other hardware devices can be constructed to implement one or more of the applications operating on the information handling system 10. Applications that may include the apparatus and systems of various embodiments can broadly include a variety of electronic and computer systems. One or more embodiments may implement functions using two or more specific interconnected hardware modules or devices with related control and data signals that can be communicated between and through the modules, or as portions of an application-specific integrated circuit.

In accordance with various embodiments of the present disclosure, the applications executed by the information handling system may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions, parameters, and profiles 123 or receives and executes instructions, parameters, and profiles 123 responsive to a propagated signal; so that a device connected to a network 50 can communicate voice, video or data over the network 50. Further, the instructions 123 may be transmitted or received over the network 50 via the network interface device or wireless adapter 40.

In other aspects, computer-readable medium that includes instructions, parameters, and profiles 123 or receives and executes instructions, parameters, and profiles 123, such as from applications 124 or OS 122, responsive to a propagated signal may communicate digital display data or instructions via flexible compression jumper connector 160. Digital display data may eventually be propagated to the graphic board and GPU 106 for processing via the GPU 106, graphics memory 107 and distributed via display pipes 148 to a first display screen 125 in some embodiments. In other embodiments, a second display screen 135 may also be deployed.

Information handling system 10 includes one or more application programs 124, and Basic Input/Output System and firmware (BIOS/FW) code. BIOS/FW code functions to initialize information handling system 10 on power up, to launch an operating system 122, and to manage input and output interactions between the operating system and the other elements of information handling system 10. In a particular embodiment, BIOS/FW code resides in memory 109, and includes machine-executable code that is executed by processor 105 to perform various functions of information handling system 10. In another embodiment, application programs 124 as a part of various instructions 123 and BIOS/FW code reside in another storage medium of information handling system 10. For example, application programs and BIOS/FW code can reside in drive 111, in a ROM (not illustrated) associated with information handling system 10, in an option-ROM (not illustrated) associated with various devices of information handling system 10, in storage system 109, static memory 110, in a storage system (not illustrated) associated with network channel of a wireless adapter 40, in another storage medium of information handling system 10, in display memory 107 in parts or in any combination thereof. Application programs 124 and BIOS/FW code can each be implemented as single programs, or as separate programs carrying out the various features as described herein.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Figure 2A:
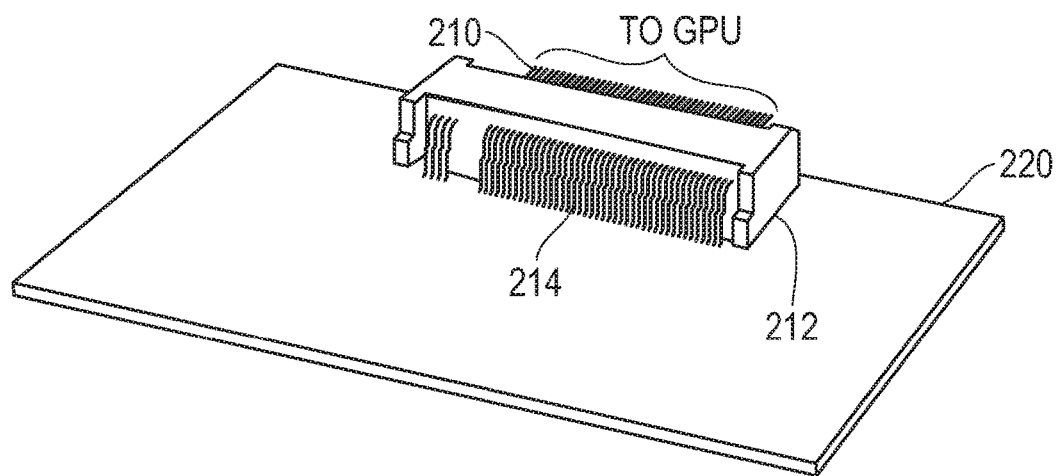
FIG. 2A is a perspective view of an M×M graphics board connector for mobile information handling system.

FIG. 2A illustrates a perspective view of M×M connector 212 on a motherboard 220 according to examples of connector systems used in the prior art. For example, M×M connector 212 is mounted to a motherboard 220 and includes a plurality of connector wires 214 providing for a 90 degree angle turn of communication connector array socket 210. Communication connector array socket 210 shows an array of wires for illustrative purposes to show the parallel connectivity between the motherboard 220 and where a graphics board would be mounted in socket 210. The M×M connector socket 210 may be connected to a graphics board arranged parallel to mother board 220. The graphics board (not shown) is connected via connector socket 210 causing a substantial offset between the motherboard 220 and the graphics board such that additional thickness may be required within an information handling system chassis.

Figure 2B:
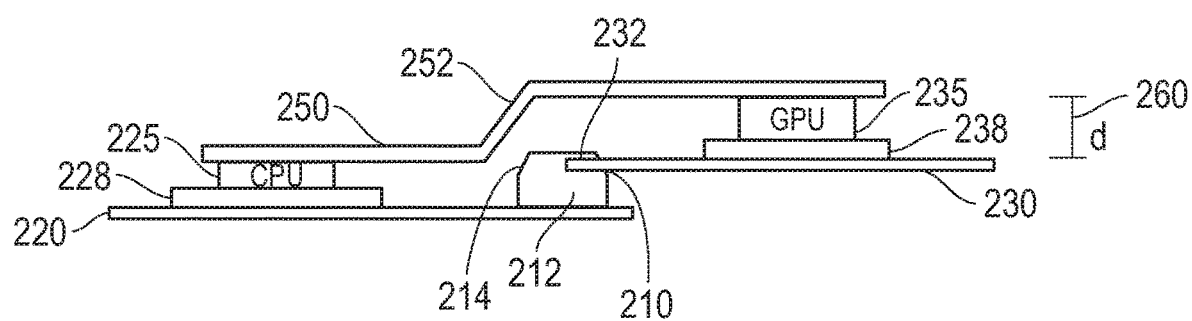
FIG. 2B is a graphic diagram showing a cross-section view of an offset between component boards with an M×M graphics board connector.

FIG. 2B shows a cross section of an M×M connector 212 and the offset between a mother board 220 and a graphic board 230. The M×M connector has a connector socket 210 in which a graphics board 230 may fit including an array of electrical contacts 232 at the edge of the graphics board 230. The edge mounted electrical contacts 232 fit into the socket 210 of the M×M connector 212. The M×M connector 212 provides for a 90-degree angle turn for communication via connectors 214 which are mounted to motherboard 220. As shown, M×M connectors such as 212 create elevation between the motherboard 220 and graphics board 230.

The motherboard 220 may include a CPU 225 and socket 228 mounted thereon providing for processing functionality of the motherboard. The CPU 225 and socket system 228 provide a specific height level to the motherboard 220. Similarly, graphics board 230 may include a GPU 235 and socket system 238 for mounting on the graphics board 230. An offset of "d" 260 is shown to occur between the top of the GPU 235 on the graphics board 230 and the top of the CPU 225 on the motherboard due to the M×M connector 212. In the event a shared heat pipe 250 is to be utilized for both the CPU 225 and GPU 235, a bend 252 or other complexity to the heat pipe must be employed to accommodate the offset "d" 260 between the top of the CPU 225 and the top of the GPU 235. Heat pipe 250 must contact the top of the CPU 225 and the top of the GPU 235 to draw off heat generated during processing and maintain cooler operating temperatures without which the processing systems may operate less effectively or may fail.

Figure 3A:
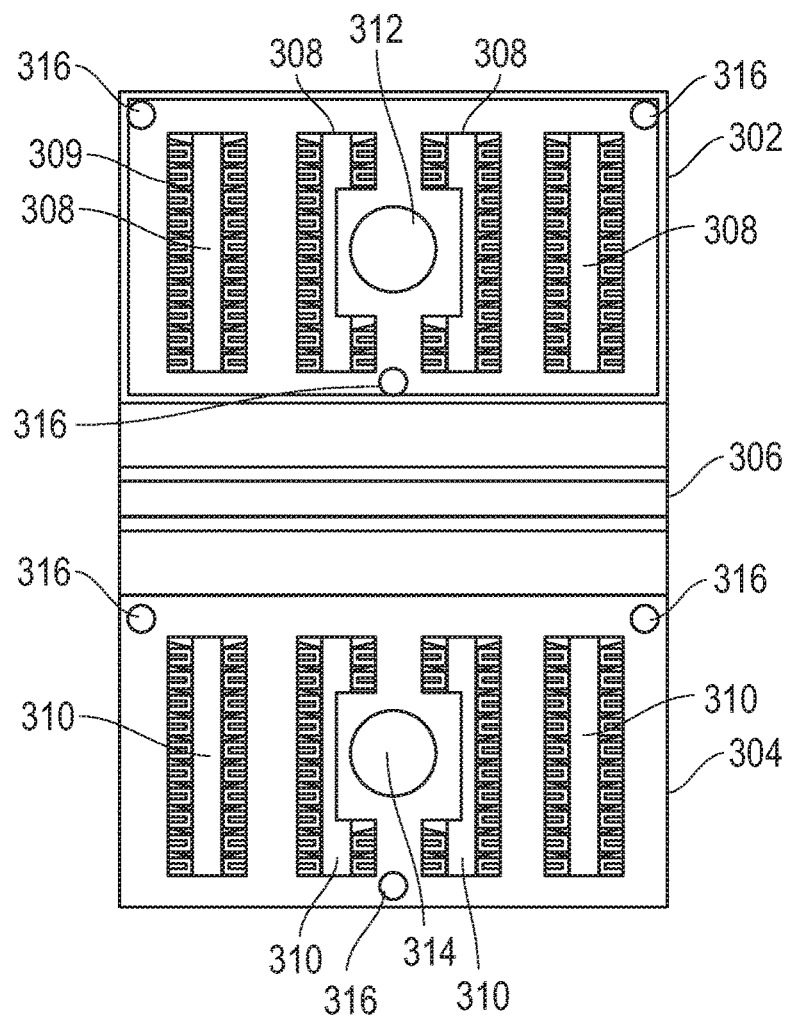
FIG. 3A is graphic diagram of a flexible compression jumper connector according to an embodiment of the present disclosure.

FIG. 3A shows a bottom view of a flexible compression jumper connector according to an embodiment of the present disclosure. The flexible compression jumper connector shown in FIG. 3A includes a first compression jumper pad 302 and a second compression jumper pad 304 for operative coupling to either a motherboard or a graphics board. Between the first compression jumper pad 302 and the second compression jumper pad 304 is an adjustable jumper trace array cable 306 connecting a first array of compressible communication contacts 308 of the first compression jumper pad 302 to a second array of compressible communication contacts 310 of the second compression jumper pad 304. The adjustable jumper trace array cable 306 may be a ribbon cable with a plurality of electrical communication wires or may be a rigid but bendable ribbon of metallic traces or communication connections between the first compression jumper pad 302 and the second compression jumper pad 304. The adjustable jumper trace array cable 306 may have a bend zone for a curve or angle that may be adjusted to alter the height or vertical orientation of the compression jumper pads 302 and 304 with respect to one another. This angle, curve, or other bend adjustment of the compression jumper pads 302 and 304 with respect to one another provides for alignment of an operatively connected motherboard and graphics board when adjacent to one another. The angle, curve, or other bend adjustment to the flexible jumper trace array cable 306 may accommodate an offset in height of the motherboard and graphics board that is less than the offset required of previous connectors such as the M×M connector. The flexible jumper trace array cable 306 adjustable transition may permit alignment of the CPU with respect to the GPU in terms of height within the information handling system housing above the chassis. However, the flexible compression jumper connector provides for generally adjacent orientation of the motherboard and graphics board to reduce overall thickness of these components within information handling systems.

The compression jumper pad 302 may include an array of compressible communication contacts 308 which, in some embodiments, may include an array of compressible electrical spring contacts. Each compressible electrical spring contact, such as shown at 309, may represent a channel or lane of a communication protocol or may include several lanes or channels depending on compression or multiplexing of those data streams. Similarly, compression jumper pad 304 may include an array of compressible communication contacts 310 which may include an array of compressible electrical spring contacts as well. As the compressible electrical spring contact is engaged and compressed via a clamping mechanism to a connector pad interface area on the motherboard or graphics board, the spring contact 309 engages with a corresponding electrical contact aligned to match up in the connector pad interface area of the motherboard or graphics board. In an example embodiment, the motherboard may have an electrical contact in its connector pad interface area that corresponds to one or more of the compressible electrical spring contacts 308 of the compression jumper pad 302. In some example embodiments, each compressible electrical spring contact 308 corresponds to an electrical contact in an array of electrical contacts of the connector pad interface area of the motherboard. Similarly, a graphics board may have one or more electrical contacts in its connector pad interface area that corresponds to one or more compressible electrical springs 310 of compression jumper pad 304 in some embodiments. In some embodiments, each compressible electrical spring contact of array 310 may have a corresponding electrical contact in the connector pad interface area of the graphics card with which it is matched.

Additional detail of the compression jumper pads 302 and 304 are shown as well. Each compression jumper pad 302 and 304 has a hole, 312 and 314 respectively, to accommodate a clamping mechanism in some embodiments. In at least one embodiment, hole 312 may accept a compression screw (not shown) through the compression jumper pad 302. A compression screw may be used with a compression screw receiver, such as a nut, mounted on or in the motherboard as a clamping mechanism in some embodiments to compress the compression jumper pad 302 to the motherboard. A compression screw may compress the compressible electrical springs 308 to the electrical contacts in the connector pad interface area of the motherboard.

In a similar embodiment, hole 314 may accept a compression screw through the compression jumper pad 304 which may be used with a compression screw receiver, such as a nut, mounted on or in the graphics board to compress the compression jumper pad 304 to the graphics board. A compression screw (now shown) may compress the compressible electrical springs 310 to the electrical contacts in the connector pad interface area of the graphics board.

In some embodiments, a compressible electrical spring contacts 308 and 310 may be made of a variety of metals or metal alloys. In some aspects, electrical conductivity, rigidity, and shape memory are important qualities as well as enough flexibility to reduce breakage of individual electrical spring contacts in arrays 308 or 310 during installation or operation. In one example embodiment, arrays of compressible electrical spring contacts 308 and 310 may be made of beryllium copper alloy which may satisfy several of these qualities. Use of beryllium copper for the compressible electrical spring contacts 308 and 310 may require a plating on the connector pad interface areas of the motherboard or graphics board to ensure optimal electrical contact between the beryllium copper compressible electrical spring contacts 308 and 310 and the plurality of electrical contacts in the connector pad interface areas. Moreover, surface plating on PCB electrical contacts in connector pad interface areas may also prevent chemical interaction between beryllium copper and the OSP finish on the PCB metal traces used for the electrical contacts. Masking may be used to provide for a coating, or plating techniques may apply a layer of electrically conductive material on the contact portions of the connector pad interface areas of the motherboard or graphics board in some embodiments. In an example embodiment, a plating using a highly conductive gold alloy or material including conductive gold may be used. For example, in one embodiment, ENIG may be used as a surface plating for the printed circuit boards of the motherboard or graphics board. In particular, ENIG may be used as surface plating on the connector pad interface areas of the motherboard or graphics board PCBs with the plurality of electrical contacts serving as PCIe communication wires or DP digital image data communication lanes from the CPU to the GPU. Other surface finishes may be used to enhance metallic compatibility or conductivity between the compressible electrical spring contacts 308 and 310 and the electrical contacts of the PCBs for the connector pad interface areas of the motherboard and graphics board. For example, direct gold plating, plating over nickel, HASL, immersion silver (IAg), and other PCB plating materials may be used in some embodiments as well.

In another aspect, compression jumper pads 302 and 304 may have alignment guides 316, such as alignment posts, guide bars, guide grooves or the like that may be used to line up compressible electrical spring contacts 308 and 310 with compression connector pad interface areas on the motherboard or graphics board in some embodiments. For example, alignment guides 316 may have corresponding alignment holes or alignment grooves in the compression connector pad interface area of the motherboard or graphics board to align the compression jumper pads 302 and 304 with the compression connector pad interface area. The alignment posts, for example, may fit into pre-located alignment holes on the motherboard or graphics board. The alignment guides 316 will align the compressible electrical spring contacts 308 and 310 with a plurality of contacts on the compression connector pad interface area of the motherboard or graphics board in some embodiments. In additional aspects, the alignment guides 316 may align the compression jumper pad holes 312 and 314 for receiving a compression screw with a compression screw receiver on or in the motherboard or graphics board in some embodiments. This may provide for ease of attachment of the compression screw through the hole 312 or 314 in the compression jumper pads 302 and 304 to a compression screw receiver. In some embodiments, the compression screw may even be disposed through the PCB of the motherboard or graphics board to a receiver, such as a nut, below or behind the motherboard or graphics board.

Figure 3B:
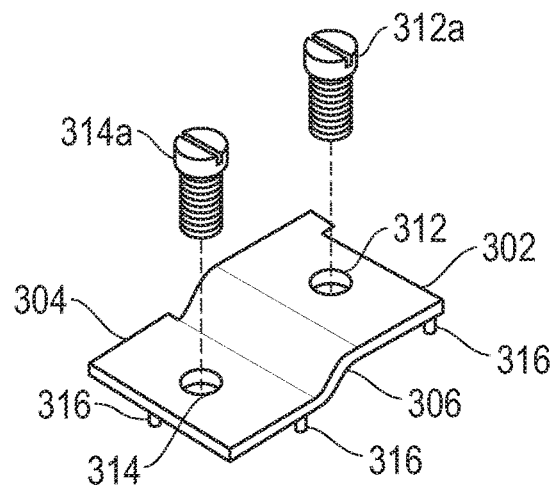
FIG. 3B is a perspective view of a flexible compression jumper connector according to an embodiment of the present disclosure.

In another embodiment, not depicted in FIGS. 3A and 3B, some aspects of embodiments of the present disclosure may utilize a flexible compression jumper connector, however the array of compressible electrical spring contacts 308 and 310 may be mounted to a compression connector pad interface area for one or either the motherboard or the graphics board instead of being disposed on the compression jumper pads. Mounting the compressible electrical spring contacts 308 and 310 may include soldering a plate including an array them to the compression connector pad interface area of the motherboard or graphics board. The compressible electrical spring contacts 308 and 310 on the plates may be mounted facing upward or away from the motherboard or graphics board. Then a compression jumper pad similar to either 302 and 304 but with an array of standard electrical contacts instead of compressible electrical spring contacts may be clamped to the mounted array of compressible electrical spring contacts 308 and 310.

The flexible compression jumper connector of this type may also include an adjustable jumper trace array cable between the two compression jumper pads similar to either 302 and 304 to traverse between the compression connector pad interface area of the motherboard and graphics board respectively. In a flexible compression jumper connector of this type in some embodiments, a clamping mechanism such as a compression screw may be disposed through a hole such as 312 and 314 to clamp the compression jumper pads, similar to 302 and 304, to the compressible electrical spring contacts 308 and 310 mounted on the compression connector pad interface areas of the motherboard and the graphics board. The compression screw may be disposed through the compression jumper pads 302 and 304, and the compressible electrical spring contact arrays 308 and 310, to a receiver on, in, or through the PCB of the motherboard or the graphics board in various embodiments. The receiver may be a compression screw receiver nut mounted on, in, or behind the PCB.

FIG. 3B shows a top perspective view of a flexible compression jumper connector according to an embodiment of the present disclosure. The flexible compression jumper connector shown in FIG. 3B includes a first compression jumper pad 302 and a second compression jumper pad 304 for operative coupling between either a motherboard or a graphics board. Between the first compression jumper pad 302 and the second compression jumper pad 304 is an adjustable jumper trace array cable 306 connecting a first array of compressible communication contacts of the first compression jumper pad 302 to a second array of compressible communication contacts of the second compression jumper pad 304. The adjustable jumper trace array cable 306 shows a bend to accommodate planar elevation differences between first compression jumper pad 302 and the second compression jumper pad 304 if the PCB of the motherboard and graphics board are not at the same planar elevation in some embodiments. For example, some offset may be necessary to accommodate a planar heat pipe or for providing orientation flexibility to the motherboard or graphics board relative to other components. As another example, some offset between the motherboard and graphics board may be necessary for alignment of external digital display data ports along a side of the information handling system in some embodiments.

The adjustable jumper trace array cable 306 may be a ribbon cable with a plurality of electrical communication wires or may be a rigid but bendable ribbon of metallic traces or communication connections between the first compression jumper pad 302 and the second compression jumper pad 304. The adjustable transition of the flexible jumper trace array cable 306 may have a bend zone with a curve or angle that may be adjusted to alter the height or vertical orientation of the compression jumper pads 302 and 304 with respect to one another. In other embodiments, the adjustable transition of the flexible jumper trace array cable 306 may be oriented with no curve or bend between the motherboard and graphics board, but the flexible compression jumper connector is usable for a plurality of internal transition options between motherboards and graphics boards for a variety of information handling system designs. Adjustment to the adjustable jumper trace array cable 306 may accommodate an offset in height of the motherboard and graphics board to permit alignment of the CPU with respect to the GPU in terms of height within the information handling system housing above the chassis and may be modified depending on the information handling system design the in which it is implemented. With this adjustability, reduced costs in implementing motherboard and graphics board designs may be realized since greater flexibility is provided to use motherboard and graphics board designs repeatedly throughout several different information handling system product specifications. Similarly, less invasive motherboard or graphics board design differences will also be necessary when different PCB designs are called for.

Each compression jumper pad 302 and 304 has a hole 312 and 314 respectively to accommodate a clamping mechanism in some embodiments. In at least one embodiment, hole 312 may accept a compression screw 312a through the compression jumper pad 302 which may be used with a compression screw receiver, such as a nut, mounted on, in, or behind the motherboard to compress the compression jumper pad 302 to the motherboard. Similarly, hole 314 may accept a compression screw 312b through the compression jumper pad 304 which may be used with a compression screw receiver, such as a nut, mounted on, in, or behind the graphics board to compress the compression jumper pad 304 to a graphics board. It is understood that in some embodiments, compression jumper pads 302 and 304 may be switched as to compression operative coupling between the motherboard or graphics board in some embodiments of the present disclosure. Further, compression jumper pads 302 and 304 may have alignment guides 316, such as alignment posts, guide bars, guide grooves or the like that may be used to line up compression jumper pads 302 and 304 with compression connector pad interface areas on the motherboard or graphics board in some embodiments. For example, alignment guides 316 may have corresponding alignment holes or alignment grooves in the compression connector pad interface area of the motherboard or graphics board to align the compression jumper pads 302 and 304 with the compression connector pad interface area. The alignment posts, for example, may fit into pre-located alignment holes on the motherboard or graphics board. Other types of alignment mechanisms may also be utilized in various embodiments.

Figure 3C:
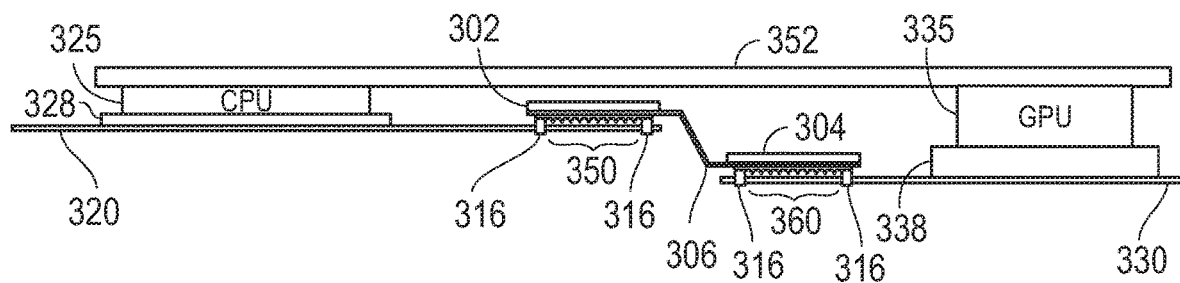
FIG. 3C is a graphic diagram showing a cross-section view of an offset correction for height difference between component boards with a flexible compression jumper connector according to an embodiment of the present disclosure.

FIG. 3C shows a cross section view of a flexible compression jumper connector implemented with a motherboard 320 and a graphic board 330 according to an embodiment of the present disclosure. The flexible compression jumper connector shown in FIG. 3C includes a first compression jumper pad 302 operatively coupled to a connector pad interface area 350 on motherboard 320. In another aspect, second compression jumper pad 304 is operatively connected to first compression jumper pad 302 via an adjustable jumper trace array cable 306. Second compression jumper pad 304 is also shown as operatively coupled to a connector pad interface area 360 on graphics board 330. A cross-section of compressible electrical spring connectors may also be seen in first and second compression jumper pads 302 and 304.

On the motherboard 320, a CPU 325 and CPU chip mount 328 are shown according to some embodiments. Likewise, on the graphics board 330, a GPU 335 and GPU chip mount 338 are similarly shown. Difference in height of the top of CPU 325 and the top of GPU 335 may be accommodated by the adjustable jumper trace array cable 306 bend, curve, or angle to adjust planar levels of compression jumper pads 302 and 304. In an example embodiment, this may be done to provide for a planar heat pipe 352 to be implemented on both the top of CPU 325 and the top of GPU 335 and across motherboard 320 and graphics board 330. In other embodiments, some motherboard to graphics board offset may be necessary for alignment with other components in the information handling system such as external display data ports with the chassis side of the information handling system.

Figure 3D:
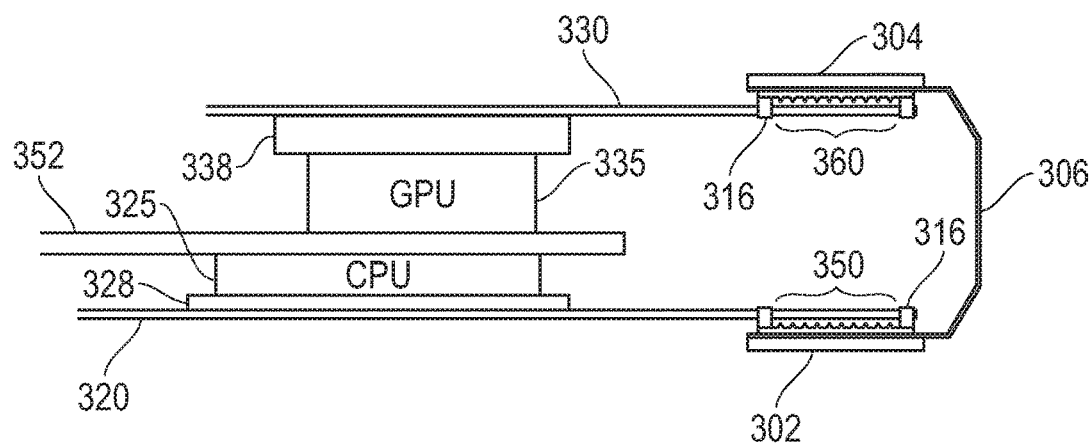
FIG. 3D is a graphic diagram showing a cross-section view of a flexible compression jumper connector used with a motherboard and graphics board according to another embodiment of the present disclosure.

FIG. 3D shows a cross section view of a flexible compression jumper connector implemented with a motherboard 320 and a graphic board 330 according to another embodiment of the present disclosure. In some instances, the implementation of a graphics board and motherboard is arranged such that minimal lateral or X and Y space is taken by the combination of the motherboard and graphics board in various embodiments. For example, the embodiment of FIG. 3D shows the graphics board and motherboard stacked such that lateral width and length of space taken in a chassis are minimized due to the stacking. This may be the case, for example, when a cooling fan or other component are already unavoidably thick, but size within the chassis of the information handling system is nonetheless to be minimized to reduce the overall size.

The flexible compression jumper connector shown in FIG. 3D includes a first compression jumper pad 302 operatively coupled to a connector pad interface area 350 on motherboard 320. In another aspect, second compression jumper pad 304 is operatively connected to first compression jumper pad 302 via an adjustable jumper trace array cable 306. Second compression jumper pad 304 is also shown as operatively coupled to a connector pad interface area 360 on graphics board 330. In some aspects, the first or second compression jumper pads 302 and 304 may be operatively coupled to connector pad interface areas 350 and 360 respectively via an interposer which is described in various embodiments herein. The adjustable jumper trace array cable 306 may be bent or curved around to allow the motherboard 320 and graphics board 330 to be stacked while maintaining high speed display data connectivity between the CPU 325 and GPU 335. A cross-section of compressible electrical spring connectors may also be seen in first and second compression jumper pads 302 and 304.

On the motherboard 320, a CPU 325 and CPU chip mount 328 are shown according to some embodiments. Likewise, on the graphics board 330, a GPU 335 and GPU chip mount 338 are similarly shown. In the shown embodiment, the motherboard 320 and graphics board 330 may be stacked such that the height of the top of CPU 325 and the top of GPU 335 may be stacked by the folded adjustable jumper trace array cable 306 bend, curve, or angle to sandwich a heat pipe 352. The curve, bend, or angle of the folded adjustable jumper trace array cable 306 may adjust planar levels of compression jumper pads 302 and 304 to size the stacking of the CPU 325 and GPU 335 with the heat pipe 352. In an example embodiment, this may be done to provide for a planar heat pipe 352 or near planar heat pipe to be implemented on both the top of CPU 325 and the top of GPU 335 and between motherboard 320 and graphics board 330. In some embodiments, the GPU 325 and GPU 335 need not be sandwiched directly on top of one another on either side of heat pipe 352, but may instead be offset to different parts of the heat pipe 352. As with other embodiments, it is understood that the heat pipe 352 need not be precisely planar, but fewer bends, angles, or turns may make the heat conductivity of heat pipe 352 more efficient. Thus, the flexible compression jumper connector may be used with a stacked motherboard 320 and graphics board 330 to minimize the complexity of heat pipe 352 in some embodiments without a requirement of a planar heat pipe.

In other embodiments, some motherboard to graphics board offset of the stacked motherboard and graphics board may be necessary for alignment with other components in the information handling system such as external display data ports with the chassis side of the information handling system or the like instead of alignment around a heat pipe 352. In yet other embodiments, both external component alignment and alignment around a heat pipe 352 may be adjusted for with the flexible compression jumper connector of the present embodiments.

Figure 3E:
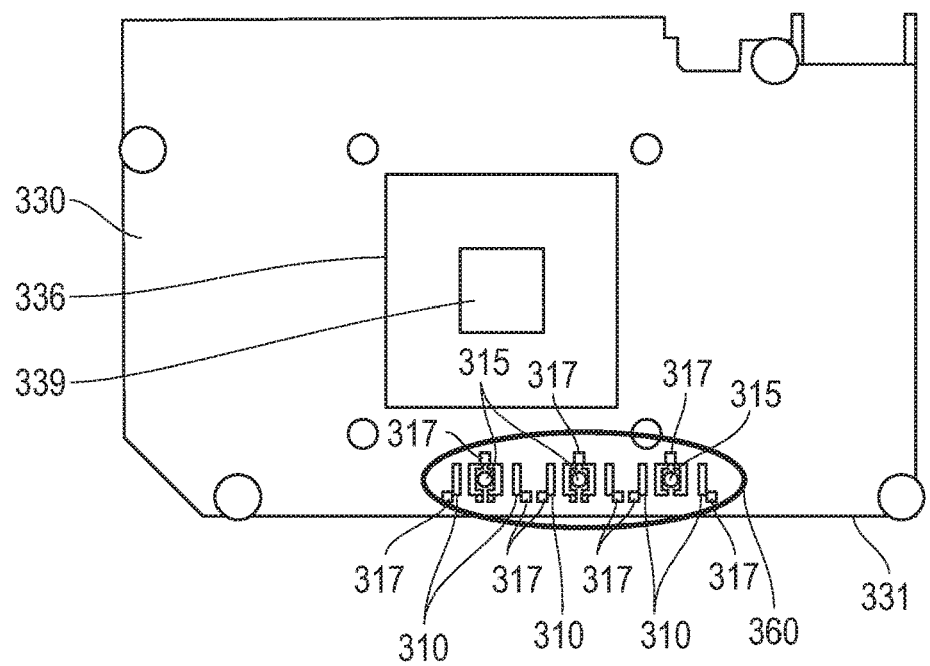
FIG. 3E is a graphic diagram showing a top view of graphics board with a compression connector pad interface area for operative coupling to a flexible compression jumper connector according to an embodiment of the present disclosure.

FIG. 3E shows a top view of a graphics board PCB 330 according to an embodiment of the present disclosure. Graphics board 330 includes a space for a GPU 339 and a space for a GPU mount 336. FIG. 3E shows an example of three connector pad interfaces in a connector pad interface area 360 (encircled) on the graphics board 330 along an edge 331. Graphics board 330 would be aligned adjacent to a motherboard (not shown) according some embodiments. Each of the connector pad interfaces in the connector pad interface area 360 on the graphics board 330 includes a plurality of electrical contacts 310 according to some embodiments. In some aspects, the plurality of electrical contacts 310 of the connector pad interfaces of the connector pad interface area 360 may be arranged to correspond to an array of compressible communications contacts in the compression jumper pad of the flexible compression jumper connector similar to that depicted in FIGS. 3A and 3B.

The graphics board 330 of FIG. 3E further shows alignment holes 317 or alignment grooves in the connector pad interface area of the graphics board corresponding to alignment guides 316 of FIGS. 3A and 3B that may align the compression jumper pads of one or more flexible compression jumper connectors. The alignment posts, for example, may fit into pre-located alignment holes 317 on the graphics board 330 along edge 331 that will be adjacent to the motherboard. Other types of alignment mechanisms may also be utilized in various embodiments. Further, graphics board 330 shows compression screw receivers 315 in or on the graphics board 330 according to some embodiments. In a further embodiment, the compression screw receivers may be mounted on the graphics board 330 at locations 315 or embedded in the PCB of graphics board 330 at 315. In other embodiments, 315 may be receiving holes through which compression screws may be disposed to a compression screw receiver behind the graphics board 330.

Figure 4:
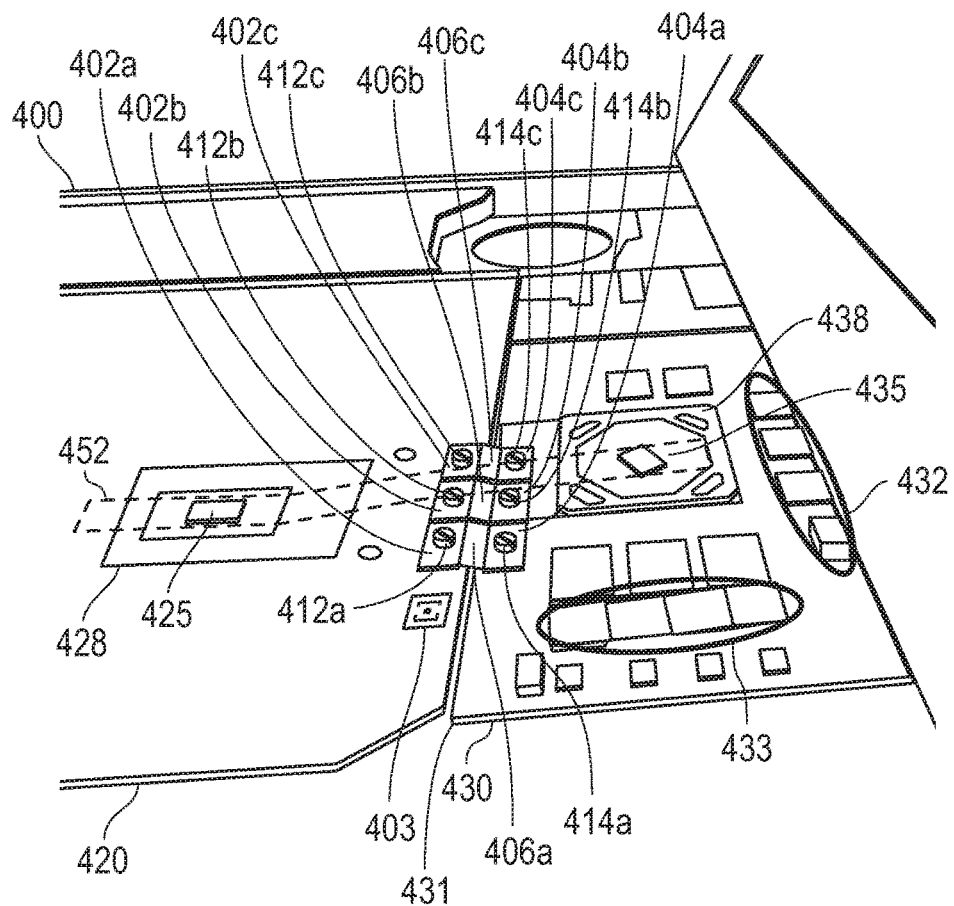
FIG. 4 is a perspective view of component boards in an information handling system cut away to show the flexible compression jumper connector between component boards according to an embodiment of the present disclosure.

FIG. 4 shows a cutaway perspective view of an example information handling system 400 including a motherboard 420 and a graphics board 430. Motherboard 420 and graphics board 430 may be arranged in information handling system 440 adjacent to one another such as along edge 431 of graphics board 430. Compression connector pad interface area of graphics board 430 along edge 431 may be aligned with a compression connector pad interface area of the motherboard such that a plurality of flexible compression jumper connectors may be operatively coupled between the PCBs to provide for digital data communications between the CPU 425 and GPU 435. The perspective view of the information handling system deploying the embodiments of the present disclosure shows a planar heat pipe 452 that may be disposed on top of CPU 425 and GPU 435 across the motherboard 420 and the graphics board 430.

A plurality of flexible compression jumper connectors are shown spanning between connector pad interface areas on the adjacent motherboard 420 and graphics board 430. Three flexible compression jumper connectors are shown each including a first compression jumper pad 402a, 402b, and 402c operatively coupled, via compression screws 412a, 412b, and 412c, to motherboard 420 in an example embodiment. The three flexible compression jumper connectors in the shown embodiment each have a flexible jumper trace array cable 406a, 406b, and 406c operatively coupled to a second compression jumper pad 404a, 404b, and 404c. The second compression jumper pads 404a, 404b, and 404c are operatively coupled to graphics board 430 in the example embodiment via compression screws 414a, 414b, and 414c. Additional or fewer flexible compression jumper connectors may be used for variable bandwidth as needed in various design embodiments. For example, an unused connector pad interface 403 is shown in the connector pad interface area of motherboard 420.

Motherboard 420 may include a CPU 425 with mounting 428. The CPU 425 and mounting 428 will have a first height for the top of the CPU 425 above motherboard 420. Graphics board 430 includes GPU 435 and GPU mounting structure 435 which may have a second height for the top of the GPU 435 above the graphics board 430. Graphics board 430 may also have additional components such as on-board memory capacity 433 which may provide for improved GPU 435 operation with the separate graphics board 430.

If the stack level of GPU 435 and mounting 438 is different from the stack level of CPU 425 and mounting 428, the flexible, adjustable jumper trace array cables 406a, 406b, and 406c for the flexible compression jumper connectors may be adjusted to bring the height of the top of CPU 425 and GPU 435 to the same level within the chassis of the information handling system. In this way, heat pipe 452 may be a planar heat pipe shared by CPU 425 and GPU 435. Graphics board 430 may also external display connector components 432 for interface outside of the chassis of the information handling system in various embodiments which may require adjustment of the offset of the motherboard 420 and graphics board 430 to align with chassis ports in some embodiments. The connector components 432 may be eDP, DP, USB, or other digital display connector components and these display connectors may be reconfigurable with respect to location for various graphics boards 430 designed for use in a variety of information handling systems produced by a manufacturer. It is understood that motherboard 420 and graphics board 430 offset adjustments with the presently disclosed embodiments may also be achieved to accommodate various other information handling system components in yet other embodiments.

The depictions in FIGS. 3A-3D and FIG. 4 are meant for illustration and do not necessarily represent accurate sizes or relationships between aspects of the flexible compression jumper connectors depicted, the motherboards, graphics boards, components, or the information handling system depicted therein. It may also be appreciated that variations on the configurations are also contemplated including location and alignments of motherboard, graphics boards, components thereon. For example, the flexible compression jumper connectors may not include compressible communication contacts on the compression jumper pads 302 and 304. Those compressible communication contacts may instead be mounted to the compression connector pad interface areas of the motherboard or graphics board such that the jumper pads are compressed onto the compressible communication contacts on the motherboard or graphics board PCB. Other variations of the embodiments are contemplated.

Figure 5:
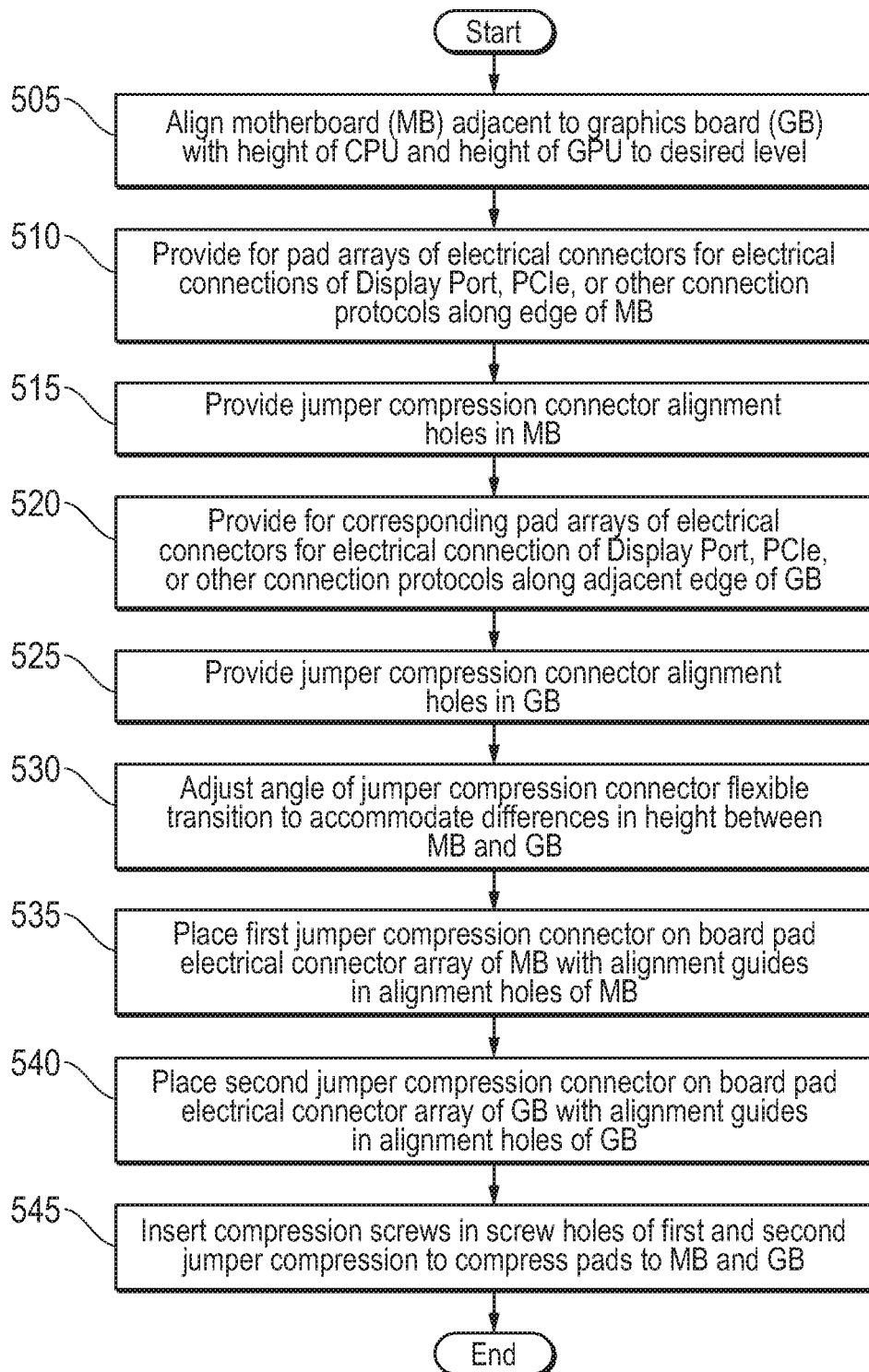
FIG. 5 is a flow diagram illustrating method of assembly for a connection between component boards according to an embodiment of the present disclosure.

FIG. 5 shows a method of aligning a motherboard and graphics board in an information handling system utilizing the flexible compression jumper connectors operatively coupled at connector pad interface areas according to an embodiment of the present disclosure. At 505, the motherboard and graphics board are designed to be arranged adjacent to one another to reduce the height or z-space occupied by both PCB boards with the information handling system. Further, the level of the top of one or more CPUs on the motherboard and the level of the top of one or more GPUs on the graphics board may be aligned by adjusting the flexible compression jumper connector or connectors between the motherboard and the graphics board. In an example embodiment, alignment with the top of the CPU and GPU may provide for a planar heat pipe to be utilized with limited bends or angles to improve efficiency of the heat pipe while permitting limited thickness of the information handling system. In other aspects, alignment of the motherboard and graphics board may be adjusted with the transition provided by the flexible compression jumper connector or connectors to accommodate other information handling system components such as external display data ports or the like.

At 510, in aligning the motherboard and graphics board, the connector pad interface areas with pad arrays of electrical connectors may be arranged along one edge of the motherboard. The connector pad interface areas are used for operative coupling to compression jumper pads of one side of the flexible compression jumper connectors. The connector pad interface areas on the motherboard may include a plurality of electrical connectors able to accommodate various digital data protocols for digital display data. For example, Display Port, PCIe, or other protocols may be used for communication of digital display data between the CPU on the motherboard and the GPU on the graphics board. At 515, alignment holes, trenches, grooves, or other alignment structure may be disposed into, on, or through the motherboard to permit ease of alignment of the first compression jumper pads of the flexible compression jumper connectors.

Proceeding to 520, the connector pad interface areas with pad arrays of electrical connectors may similarly be arranged on the graphics board along the edge to be adjacent to the motherboard. Similar digital data protocols may be used for the electrical communication connections via the connector pad interface areas on the graphics board as were used on the motherboard. At 525, the graphics board may also have alignment holes, trenches, grooves, or other alignment structure may be disposed into, on, or through it to permit ease of alignment of the first compression jumper pads of the flexible compression jumper connectors to the connector pad interface areas of the graphics board.

At 530, the angle or curve of the adjustable transition provided by the flexible jumper trace array between the first and second compression jumper pads of the flexible compression jumper connectors may be set to allow for offset difference in height between the PCB boards of the motherboard and graphics board, if any. This adjustable transition provides for desired alignment of the two PCB boards. In some cases, the motherboard and graphics board PCBs will align in height when mounted in the chassis of the information handling system. In other embodiments, the height of the tops of the CPU and the GPU may be required for alignment in height for use of a planar heat pipe or for other reasons. For example, some difference between the first and second compression jumper pads may be needed for operative coupling between other information handling system components to the motherboard or graphics board PCBs. In example embodiments, the adjustable jumper trace array is flexible, but rigid enough to hold its shape and may be reconfigurable as to angle or curve to allow for alignment of the compression jumper pads with the plurality of electrical connectors on the connector pad interface areas of the motherboard and the graphics board.

Proceeding to 535, the first jumper compression pad may be placed on the motherboard connector pad interface area using the alignment guides to align the compressible electrical connectors of the first jumper compression pad with the plurality of electrical connectors embedded in the PCB of the motherboard. In some embodiments, the connector pad interface area has a plurality of electrical connectors in the PCB of the motherboard that may be coated or plated with a conductive material to avoid metal reaction with an OSP finish or to provide for improved electrical connection via the compressible communication contacts of the first jumper compression pad. For example, ENIG or another coating or plating with gold content may be applied to the PCB connector pad interface area electrical connectors if the finish on the metal traces used in the PCB would conflict with the alloy used for compressible electrical spring contacts in the first jumper compression pad. Several types of conductive plating materials may be used as discussed in embodiments herein. The conductive plating may further ensure good electrical contact between the electrical spring contacts of the flexible compression jumper connector and the corresponding contact on the connector pad interface area of the motherboard to provide for digital data communications.

Proceeding to 540, the second jumper compression pad may be placed on the graphics board connector pad interface area using the alignment guides to align the compressible electrical connectors of the second jumper compression pad with the plurality of electrical connectors embedded in the PCB of the graphics board. As described above, in some embodiments, the connector pad interface area with a plurality of electrical connectors in the PCB of the graphics board may be coated with a conductive material to avoid metal reaction or provide for improved electrical connection via the compressible communication contacts of the second jumper compression pad. For example, ENIG or another plating material with gold content may be applied to the PCB connector pad interface area electrical connectors if the finish on the metal traces used in the PCB would conflict with the alloy used for compressible electrical spring contacts in the second jumper compression pad of the flexible compression jumper connector. Several types of conductive plating materials may be used as discussed in embodiments herein. The conductive plating may further ensure good electrical contact between the electrical spring contacts of the flexible compression jumper connector and the corresponding contact on the connector pad interface area of the motherboard to provide for digital data communications.

At 545, compression screws or another clamping system may be employed to compress the first and second compression jumper pads of the flexible compression jumper connector to the connector pad interface areas of the motherboard and the graphics board respectively. In an example embodiment, compression screws may be disposed through holes in the first and second compression jumper pads to receivers mounted on, in, or below the motherboard and graphics board respectively. The compression screw receivers may be a compression screw nut into which the compression screws may be tightened to compress the first and second compression jumper pads to the plurality of electrical contacts in the connector pad interface areas of the motherboard and the graphics board. As the first and second compression jumper pads are compressed down, the compressible communication contacts, such as electrical spring contacts, are mechanically pressed into contact with the plurality of corresponding electrical contacts on the motherboard or graphics board to establish an electrical contact for each active motherboard and graphics board electrical contact to communicate digital display data across a trace of the flexible compression jumper connector between the motherboard and the graphics board. It is understood that other clamping mechanisms may be used including a c-clamp, a clip, a cinchable band, a tie, or other mechanism to compress the first and second compression jumper pads to the motherboard and graphics board respectively. It is further understood that in some embodiments, the first or second compression jumper pads may be switched in that the flexible compression jumper connector between the motherboard and the graphics board may be bi-directional. The flexible compression jumper connector between the motherboard and the graphics board provide for a substantial level of channels or lanes of electrical contact between the CPU and GPU for digital display communication while providing for powerful graphics processing on a separate PCB from a motherboard. The flexible compression jumper connector between the motherboard and the graphics board may also provide for arrangement of the graphics board with respect to the motherboard to provide for reduced thickness in the space occupied by those PCBs as well as providing for other potential efficiencies such as use of an efficient, planar heat pipe. Various arrangements and embodiments are contemplated with the use of the flexible compression jumper connector between the motherboard and the graphics board in accordance with variations of the embodiments discussed herein. The variations in arrangements of the motherboard and graphics board in information handling systems according to the embodiments herein provide for an ability to utilize motherboard and graphics board designs or minimal variations of the same in a variety of information handling system product types. These efficiencies also coincide with the benefits of maintaining reduce thickness of the information handling systems and providing for flexible connectivity levels with adjustment to the number of flexible compression jumper connectors for various information handling system designs.

Figure 6:
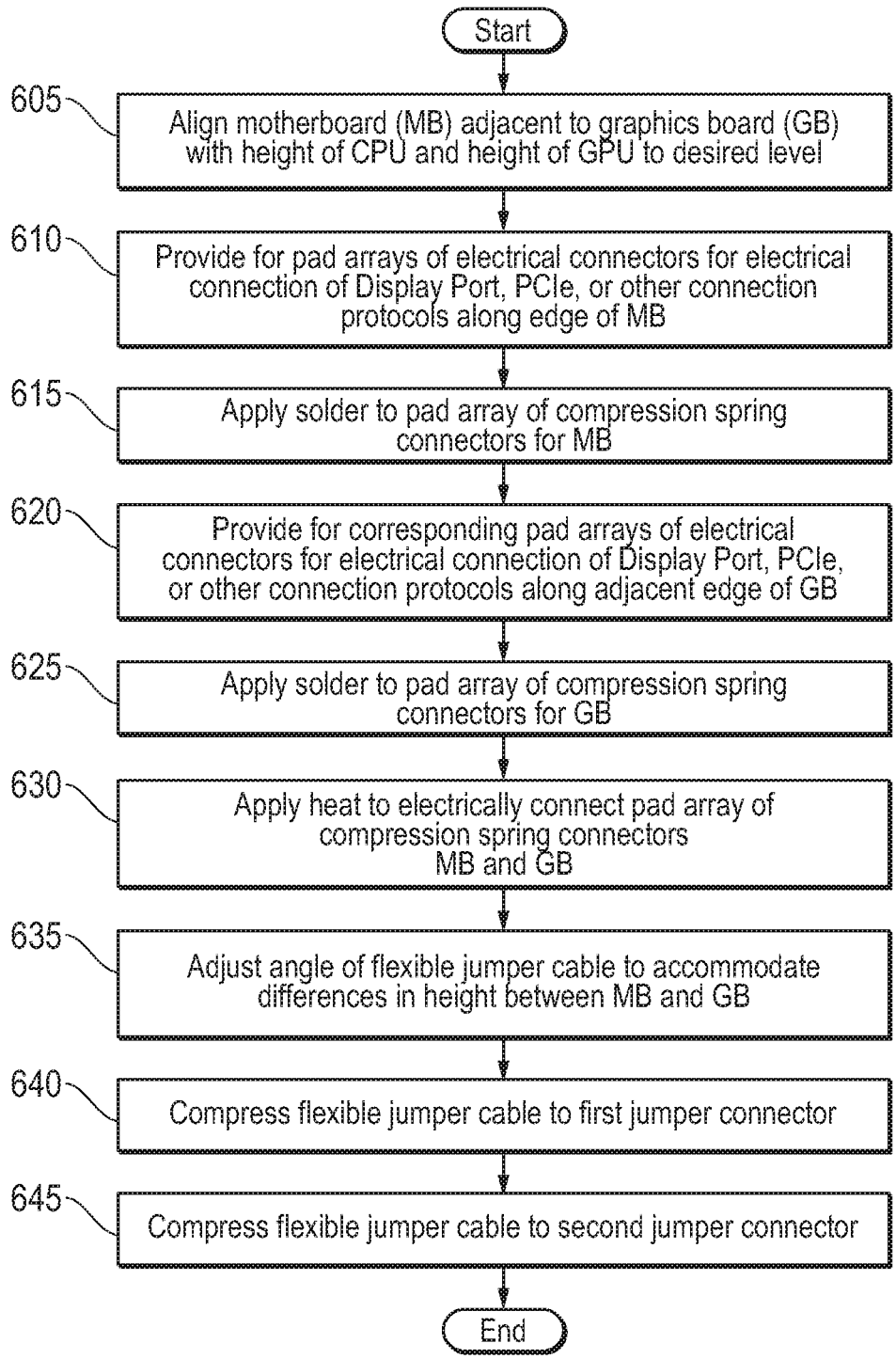
FIG. 6 is a flow diagram illustrating method of assembly for a connection between component boards according to another embodiment of the present disclosure.

FIG. 6 shows a method of aligning a motherboard and graphics board in an information handling system utilizing flexible compression jumper connectors at connector pad interface areas according to another embodiment of the present disclosure. In the embodiment of FIG. 6, the compressible communication contacts may not be provided on the first or second compression jumper pad of the flexible compression jumper connectors, but instead may be mounted face-up on the plurality of electrical contacts of connector pad interface areas of the motherboard and graphics board respectively. At 605, the motherboard and graphics board are designed to be arranged adjacent to one another to reduce the height occupied by both PCB boards with the information handling system. Further, the height of the top of one or more CPUs on the motherboard and the height of the top of one or more GPUs on the graphics board may be aligned by adjusting the flexible compression jumper connector or connectors between the motherboard and the graphics board in some embodiments. In an example embodiment, alignment with the top of the CPU and GPU may provide for a planar heat pipe to be utilized with limited bends or angles to improve efficiency of the heat pipe while permitting limited thickness of the information handling system. In other embodiments, offset between a motherboard and graphics board may be designed to accommodate interface of those PCBs with other components of the information handling system being designed.

At 610, in aligning the motherboard and graphics board, the connector pad interface areas with pad arrays of electrical connectors may have compression spring contacts mounted in an array on the connector pad interface area of the motherboard. The connector pad interface area of the motherboard may be arranged along one edge of the motherboard. A disk or other structure may support a mountable pad arrays of compression spring contacts. The mountable pad arrays of compression spring contacts may be aligned over the connector pad interface areas for each intended flexible compression jumper connectors. The plurality of electrical contacts in the connector pad interface areas the motherboard and the mounted compression spring contacts thereon may include a plurality of electrical connectors able to accommodate various digital data protocols for digital display data. For example, Display Port, PCIe, or other protocols may be used for communication of digital display data between the CPU on the motherboard and the GPU on the graphics board.

At 615, the mountable pad arrays of compression spring contacts may be mounted to the motherboard connector pad interface area and aligned via alignment holes, trenches, grooves, or other alignment structure mechanisms disposed into, on, or through the motherboard to permit ease of alignment in some embodiments. The mountable pad array of compression spring contacts may be two sided, a bottom side having an array of electrical contacts that may be soldered to the plurality of contacts in the connector pad interface area of the motherboard. Solder balls, masked solder paste, or other techniques may be used to solder the mountable pad array of compression spring contacts to the electrical contacts of the connector pad interface area of the motherboard. Additional mechanical mounting of the mountable pad array of compression spring contacts may be used for mechanical stability when mounting to the motherboard. The top-facing side, or side facing away from the motherboard surface, will have a plurality of compression spring contacts exposed for operative coupling to the first compression jumper pads of the flexible compression jumper connectors.

Proceeding to 620, the connector pad interface areas with pad arrays of electrical connectors may similarly be arranged on the graphics board along the edge to be adjacent to the motherboard. Similar digital data protocols may be used for the electrical communication connections via the connector pad interface areas on the graphics board as were used on the motherboard. A mountable pad array of compression spring contacts may similarly be used to operatively couple the plurality of electrical connectors in the connector pad interface area of the graphics board with the compression jumper pads of the flexible compression jumper connectors as described above for the motherboard. At 625, the graphics board may also have alignment holes, trenches, grooves, or other alignment structure disposed into, on, or through it to permit ease of alignment of the mountable pad array of compression spring contacts onto the graphics board. The mountable pad array of compression spring contacts may be two-sided with an upward facing side including the compression spring contacts for operable coupling to second compression jumper pads of the flexible compression jumper connectors from the connector pad interface areas of the graphics board. The bottom side of the mountable pad array of compression spring contacts may have an array of electrical contacts that may be soldered to the plurality of contacts in the connector pad interface area of the motherboard. Application of solder, via solder ball application or masked solder paste, may be used to electrically couple the mountable pad array of compression spring contacts to the graphics board. Additional mechanical mounting of the mountable pad array of compression spring contacts may also be used for additional mechanical stability.

Proceeding to 630, application of heat may electrically connect the mountable pad array of compression spring contacts on the motherboard and the graphics boards respectively such that each has an upward facing plurality of compressible spring contacts for engagement with the flexible compression jumper connector or connectors for establishing a plurality of communication channels or lanes between the CPU and GPU for digital display data.

At 635, the angle or curve, if any, of the adjustable transition provided by the flexible jumper trace array between the first and second compression jumper pads of the flexible compression jumper connectors may be set to allow for any difference in height between the PCB boards of the motherboard and graphics board. The adjustable transition permits desired alignment of the two PCB boards such that the PCB boards may be used in a variety of information handling system model designs. In some cases, the motherboard and graphics board PCBs will align in height when mounted in the chassis of the information handling system. In other embodiments, the height of the tops of the CPU and the GPU may be required for alignment in height for use of a planar heat pipe or for other reasons. In other embodiments, some difference between the first and second compression jumper pads may be needed for operative coupling between other components of the information handling system model and the motherboard or graphics board PCBs. In example embodiments, the flexible jumper trace array is flexible, but rigid enough to hold its shape and may be reconfigurable as to angle or curve to allow for alignment of the compression jumper pads with the plurality of electrical connectors on the connector pad interface areas of the motherboard and the graphics board.

Proceeding to 640, the first jumper compression pad may be placed on the mounted pad array of compression spring contacts that is mounted to the motherboard connector pad interface area in some embodiments. Further, alignment guides may be used to align the first jumper compression pad with the compressible electrical connectors of mounted pad array of compression spring contacts. In some embodiments, the first compression jumper pad may be made of, or coated with, a conductive material that avoids metal reaction or provide for improved electrical connection between the mounted pad array of compression spring contacts and the first jumper compression pad. For example, ENIG or another coating with gold content may be applied to the first compression jumper pad if the finish on the metal traces used in the first compression jumper pad would conflict with the alloy used for the mounted compressible electrical spring contacts on the motherboard. Several types of conductive plating materials may be used as discussed in embodiments herein. The conductive plating may be used to further ensure good electrical contact between the electrical spring contacts and the corresponding contact on the connector pad interface area of the motherboard to provide for digital data communications with the motherboard in other embodiments.

Compression screws or another clamping system may be employed to compress the first compression jumper pads of the flexible compression jumper connector to the mounted pad array of compression spring contacts on the motherboard. In an example embodiment, compression screws may be disposed through holes in the first compression jumper pads to receivers mounted on, in, or below the mounted pad array of compression spring contacts or on, in, or below the motherboard. The compression screw receivers may be a compression screw nut into which the compression screws may be tightened to compress the first compression jumper pads to the mounted pad array of compression spring contacts on the connector pad interface areas of the motherboard. As the first compression jumper pads are compressed down, the compressible communication contacts, such as electrical spring contacts, of the mounted pad array of compression spring contacts are mechanically pressed into contact with the plurality of corresponding electrical contacts on first compression jumper pad to establish an electrical contact for each active motherboard electrical contact. In this way, the established electrical contacts may be used to communicate digital display data across a trace of the flexible compression jumper connector between the motherboard and the graphics board. It is understood that other clamping mechanisms may be used including a c-clamp, a clip, a cinchable band, a tie, or other mechanism to compress the first compression jumper pads to the mounted pad array of compression spring contacts may be used.

Proceeding to 645, the second jumper compression pad may be placed on the mounted pad array of compression spring contacts that is mounted to the graphics board connector pad interface area in some embodiments. Further, alignment guides may be used to align the second jumper compression pad with the compressible electrical connectors of mounted pad array of compression spring contacts. In some embodiments, the second compression jumper pad may also be made of, or coated with, a conductive material that avoids metal reaction or provide for improved electrical connection between the mounted pad array of compression spring contacts and the second jumper compression pad. For example, ENIG or another coating with gold content may be applied to the second compression jumper pad if the finish on the metal traces used in the second compression jumper pad would conflict with the alloy used for the mounted compressible electrical spring contacts on the graphics board. Several types of conductive plating materials may be used as discussed in embodiments herein. The conductive plating may be used to further ensure good electrical contact between the electrical spring contacts and the corresponding contact on the connector pad interface area of the graphics board to provide for digital data communications with the graphics board in other embodiments.

Again, compression screws or another clamping system may be employed to compress the second compression jumper pads of the flexible compression jumper connector to the mounted pad array of compression spring contacts on the graphics board. In an example embodiment, compression screws may be disposed through holes in the second compression jumper pads to receivers mounted on, in, or below the mounted pad array of compression spring contacts or the graphics board. The compression screw receivers may be a compression screw nut into which the compression screws may be tightened to compress the second compression jumper pads to the mounted pad array of compression spring contacts on the connector pad interface areas of the graphics board. As the second compression jumper pads are compressed down, the mounted pad array of compression spring contacts are mechanically pressed into contact with the plurality of corresponding electrical contacts on second compression jumper pad to establish an electrical contact for each active graphics board electrical contact in the graphics board connector pad interface to communicate digital display data across a trace of the flexible compression jumper connector between the motherboard and the graphics board. It is understood that other clamping mechanisms may be used including a c-clamp, a clip, a cinchable band, a tie, or other mechanism to compress the second compression jumper pads to the mounted pad array of compression spring contacts may be used.

Figure 7A:
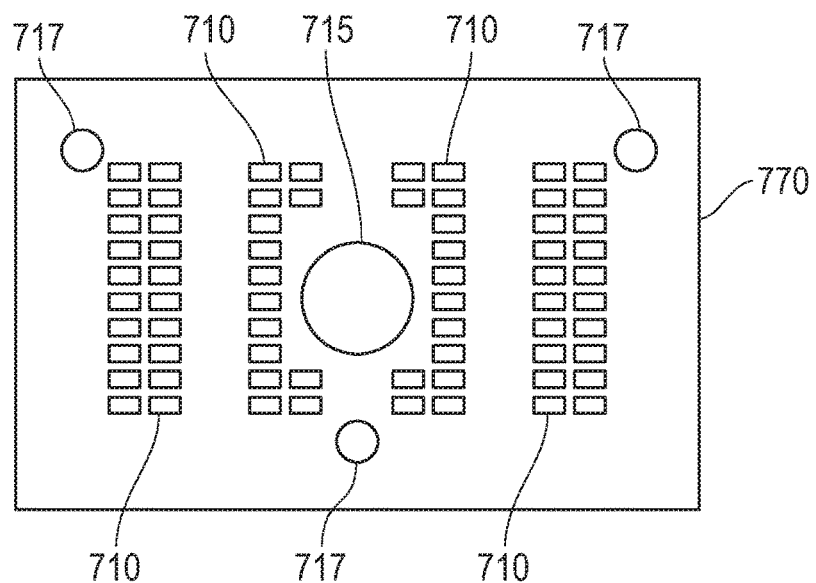
FIG. 7A is a top view of a localized plating interposer according to an embodiment of the present disclosure.

FIG. 7A shows a top view of a localized plating interposer plate 770 according to an embodiment of the present disclosure. The localized plating interposer plate 770 shown in FIG. 7A includes an array of pass-through electrical contacts 710. The localized plating interposer plate 770 may appear substantially similar on the opposite side of the top view shown as well. In other words, the array of pass-through electrical contacts 710 are exposed on the bottom side of interface 770 as well. In an embodiment, one side may be soldered to a contact pad interface on a motherboard or a graphics board. For example, the bottom side of the interposer plate 770 may serve as a solder side of interposer plate 770. In another embodiment, another side, such as the top side, of the interposer plate 770 may be plated with a neutral metal material that will be compatible with and provide conductivity with the metal or metal alloy of compressible communication contacts of a flexible compression jumper connector of several embodiments herein. It is also possible that the bottom side contact pad interface is designed differently than the top side in order to achieve the most compatible pad design with normal PCB assembly manufacturing line. For example, the bottom side contact pad interface can implement round or oval pads spaced and staggered such that normal solder paste can be applied within manufacturing guidelines, as opposed to use of solder balls. In either case, the bottom side is designed to match the motherboard while the top side is designed to match the jumper compression spring contacts.

The interposer plate 770 may be coated with an anti-tarnish finish such as OSP on both sides as is typical when manufactured as a series of PCB plates. In some embodiments, one side may be plated with a neutral metal material to facilitate compression contact with compressible communication contacts on the compression jumper pad of flexible compression jumper connectors used with the embodiments herein. By plating one side, the use of the interposer plate 770 avoids expense and inefficiency of having to apply localized plating to a motherboard or graphics board during manufacture of each. The plating of at least one side negates the potential chemical interaction of OSP with the material used for the compressible communication contacts and enhances conductivity of a compression contact. For example, the interposer plates 770 may be plated on one side with a neutral metal plating including ENIG, flash gold, gold plate, or other high conductivity materials that will not adversely react to beryllium copper alloy as would OSP or other anti-tarnish coatings. The interposer plates may be manufactured with plating on one side and attached to a tape reel of interposer plates or a stack or tray of interposer plates. In some embodiments, plating may be on both sides as well, but cost of plating materials, such as those with gold content, may be more expensive depending on plating techniques or benefits of both sides being plated during assembly of an information handling system according to embodiments herein.

Since the other side of interposer 770 will be soldered, the solder flux will eliminate the OSP at the contacts. Thus, for this reason as well plating both sides of the interposer plates 770 may be unnecessary. However, in some cases plating both sides may benefit manufacturing and assembly processes by simplifying processes or steps involved. Each interposer plate 770 may be selected as needed from the mass-produced supply during assembly of information handling systems. An array of solder balls or masked solder paste may be applied to the side of the interposer plate 770 to be soldered to the motherboard or graphics board. The solder will be applied to the array of pass-through electrical contacts 710 exposed on the bottom side or solder side of the interposer 770. Then the interposer plate 770 may be dropped into alignment via alignment guides with contact pad interface in some embodiments to align with the electrical contact array of a connector pad interface on the motherboard or graphics board in some embodiments. The motherboard or graphics board may be heated, in whole or in part, to affix the solder bonds for electrical connection between the pass-through contact array 710 of interposer plate 770 and an electrical contact array at the contact pad interface.

The interposer 770 may also have one or more alignment guides 717 which may be the same on each side or may be different between the two sides. Alignment guides 717 may be, for example, holes or grooves in the interposer plate 770 to receive alignment guides from a compression jumper pad of a flexible compression jumper connector as described in embodiments herein. The alignment guides of the compression jumper pad may pass through the interposer plate 770 at holes 717 and into alignment guide receivers in the contact pad interface of the motherboard or graphics board in some embodiments. In other embodiments, the interposer plate may have alignment guides (not shown) on the bottom side, or solder side, of the interposer plate 770. Those alignment guides, such as posts, may fit into alignment receivers in the motherboard or graphics board to align the interposer plate 770 pass-through electrical contacts 710 for soldering to the connection pad interface thereon. In such an embodiment, the top-side or plated side of the interposer 770, may have alignment guides or alignment guide receivers 717 to align the compression jumper pads for flexible compression jumper connectors with the interposer 770 as well. The compression jumper pad alignment guides, such as alignment posts in some embodiments, may fit into the alignment guide receivers 717 and align an array of compressible communication contacts with the pass-through electrical contacts 710 on the plated side of the interposer 770.

The interposer plate 770 may have a hole 715 for receiving a clamping mechanism in some embodiments. In a particular embodiment, hole 715 may receive a compression screw which may pass through interposer plate 770 to a compression screw receiver such as a nut below the interposer plate 770. As discussed, a compression screw receiver may be below the interposer 770, mounted on or in the PCB of a motherboard or graphics board, or may be below the PCB of the motherboard or graphics board. Other clamping mechanisms may be used as well including some described in embodiments herein.

The interposer plate 770 may be a PCB plate with copper pass-through electrical contacts 710 in one example embodiment. The plated side, such as the top side of the interposer plate 770, may then engage the compressible communication contact array on the compression jumper pad of the flexible compression jumper connector according to various embodiments herein. Upon compression of the compressible communication contact array, electrical spring contacts may be mechanically pressed into the plated pass-through electrical contacts 710. With the plating, minimal chemical interaction will occur and enhanced electrical contact will be achieved when the flexible compression jumper connector is operatively connected to the interposer plate 770. Further, the cost or inefficiency of plating, including targeted plating, of the motherboard or graphics board may be avoided. The compression may achieve communication electrical contact between the motherboard and the graphics board via the flexible compression jumper connector or connectors. To solve the system configuration where multiple GPUs with varying heights are supported, the interposer plate 770 can be installed on one side but not the other. This allows the same jumper trace array 706 to be used across system configurations. For example, a GPU with less height can implement localized plating on the PCB instead of the interposer plate 770 which causes the board assembly height to move upward in relation to the motherboard thus allowing the same, less complex heat pipe to work efficiently in the chassis layout of PCBs.

In yet other embodiments, the interposer 770 may be similar on two sides including the alignment guides or alignment guide receivers 717, the pass-through electrical contact configuration, and the plating. With both sides having plating, it becomes unnecessary to track which side of the interposer 770 is a plated side and which side is a solder side according to some embodiments herein. The interposer plate 770 may be added to the motherboard or graphics board without concern for which side faces the connector pad interface and which side faces the flexible compression jumper connector. This embodiment may expedite manufacturing in some aspects.

Figure 7B:
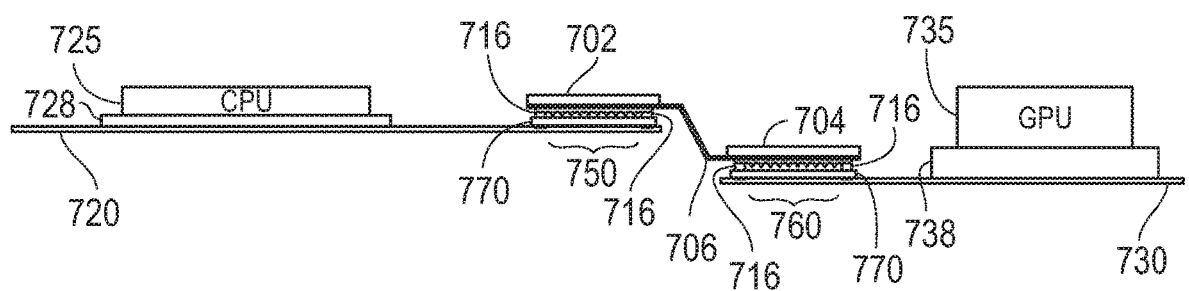
FIG. 7B is a graphic diagram showing a cross-section view of an offset correction for height difference between component boards with a flexible compression jumper connector and localized plating interposers according to an embodiment of the present disclosure.

FIG. 7B shows a cross section view of a flexible compression jumper connector implemented where interposers 770 are inserted below the flexible compression jumper connector compression jumper pads 702 and 704. A first interposer 770 is inserted between a motherboard 720 and compression jumper pad 702 in the shown embodiment. A second interposer 770 is inserted between a graphic board 730 and the compression jumper pad 704 according to an embodiment of the present disclosure. The first compression jumper pad 702 is operatively coupled to a connector pad interface area 750 via interposer 770 on motherboard 720 in a first aspect. Second compression jumper pad 704 is also shown as operatively coupled to a connector pad interface area 760 on graphics board 730 via another interposer plate 770.

In another aspect, second compression jumper pad 704 is operatively connected to first compression jumper pad 702 via an adjustable jumper trace array cable 706. The adjustable jumper trace array 706 enables a flexible transition between levels of the first compression jumper pad 702 and the second compression jumper pad 704 to accommodate any offset between motherboard 720 and graphics board 730. A cross-section of compressible electrical spring connectors may also be seen in first and second compression jumper pads 702 and 704 which are in contact with interposer plate 770.

As with previous embodiments, the motherboard 720 may have a CPU 725 and CPU chip mount 728 as shown according to some embodiments. Likewise, the graphics board 730 may have a GPU 735 and GPU chip mount 738 as similarly shown. Difference in height of the top of CPU 725 and the top of GPU 735 may be accommodated by the adjustable jumper trace array cable 706 bend, curve, or angle to adjust planar levels of compression jumper pads 702 and 704. The adjustment of the planar levels of compression jumper pads 702 and 704 may accommodate necessary offset between the motherboard 720 and graphics board 730 for alignment of the CPU 725 and GPU 735 or to align either PCB for connection of other information handling system components as described. In one example embodiment, this may be done to provide for a planar heat pipe (not shown) to be implemented on both the top of CPU 725 and the top of GPU 735 and across motherboard 720 and graphics board 730. In other embodiments, some motherboard to graphics board offset may be necessary for alignment with other components in the information handling system such as external display data ports aligned with the chassis side of the information handling system.

An interposer plate 770 is shown disposed between a connector pad interface 750 and compressible electrical spring contacts of the first compression jumper pad 702. Alignment guides 716 (which may not both fall into the cross section in some embodiments) are shown on the compression jumper pads 702 and 704 and extending to the interposer plates 770. The alignment guides 716 may be used to align the compressible electrical spring contacts of the compression jumper pads 702 and 704 with the pass-through array of electrical contacts of the interposer 770. A clamping mechanism, such as a clamping screw (not shown), may compress the compressible electrical spring contacts into the pass-through array of contacts on a plated side of the interposer plate 770. The interposer plate 770 may also be soldered to the connector pad interface 750 of the motherboard 720 according to embodiments herein.

Figure 8:
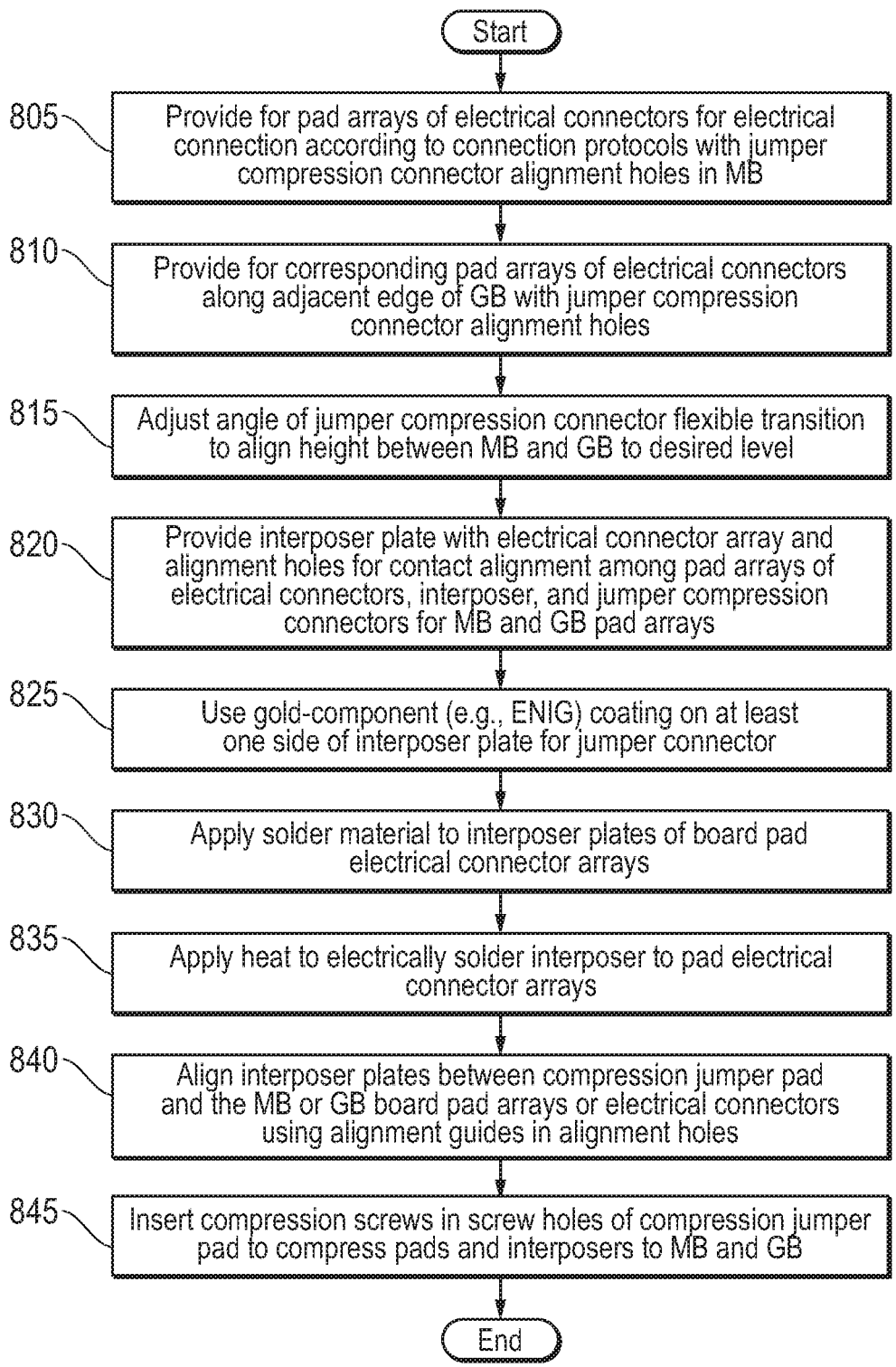
FIG. 8 is a flow diagram illustrating method of assembly for a connection between component boards with localized plating according to an embodiment of the present disclosure.

FIG. 8 shows a method of aligning a motherboard and graphics board in an information handling system utilizing flexible compression jumper connectors and interposer plates at connector pad interface areas according to another embodiment of the present disclosure. The motherboard and graphics board are designed to be arranged adjacent to one another to reduce the height occupied by both PCB boards with the information handling system. Further, the height of the top of one or more CPUs on the motherboard and the height of the top of one or more GPUs on the graphics board may be aligned by adjusting the flexible compression jumper connector or connectors between the motherboard and the graphics board in some embodiments. In an example embodiment, alignment with the top of the CPU and GPU may provide for a planar heat pipe to be utilized with limited bends or angles to improve efficiency of the heat pipe while permitting limited thickness of the information handling system. In other embodiments, offset between a motherboard and graphics board may be designed to accommodate interface of those PCBs with other components of the information handling system being assembled.

At 805, an array of electrical connectors may be provided along an edge of a motherboard to establish a connector pad interface for use with the flexible compression jumper connectors and interposer plates of the embodiments herein. The edge of the motherboard with the connector pad interface may be intended to be aligned adjacent to the graphics board in the assembled information handling system. The connector pad interfaces of the motherboard may accommodate digital display data protocols according to various embodiments described herein. Alignment guides, such as alignment holes, may be associated with the connector pad interface of the motherboard to provide alignment for the interposer, the compression jumper pad of the flexible compression jumper connectors, or both in some embodiments.

Proceeding to 810, an array of electrical connectors may also be provided along an edge of a graphics board to establish a connector pad interface for use with the flexible compression jumper connectors and interposer plates of the embodiments herein. Similarly, the edge of the graphics board with the connector pad interface may be intended to be aligned adjacent to the motherboard in the assembled information handling system. The connector pad interfaces of the graphics board may also accommodate the digital display data protocols according to various embodiments described herein. Alignment guides, such as alignment holes, may be associated with the connector pad interface of the graphics board to provide alignment for another interposer, the second compression jumper pad of the flexible compression jumper connectors, or both. The flexible compression jumper connectors operatively connect the graphics board and the motherboard between the respective connector pad interfaces along a shared edge in an adjacent orientation upon assembly of the information handling system.

At 815, the angle or curve of the flexible compression jumper connectors may provide an adjustable transition between the first compression jumper pad on the motherboard and the second compression jumper pad on the graphics board. The assembly will require determination of what levels the adjacent motherboard and graphics board must be mounted in the chassis to achieve connection with heat pipes or other components in the final information handling system assembly. This may vary among product designs for various models of information handling system which may utilize the same motherboard, graphics board, or both. The angle or curve of the flexible compression jumper connectors is modified via bending the adjustable jumper trace array. With this flexible transition between the first and second compression jumper pads, the interface levels may be set with respect to the motherboard and graphics board and any interposers used according to embodiments herein.

Proceeding to 820, an interposer plate is manufactured from PCB with an array of pass-through electrical communication contacts. In an example embodiment, the array of pass-through electrical communication contacts is made of copper, silver, or another conductor. The PCB interposer plate is coated with an anti-tarnish coating such as OSP. The interposer plate is further manufactured with alignment guides necessary to align the interposer plate with the connection pad interface of a motherboard and graphics board on one side, and align the interposer with a first or second compression jumper pad of the flexible compression jumper connectors used in various embodiments herein on the other side. The array of pass-through contacts on the interposer may align with arrays of contacts on the connection pad interfaces of the motherboard or graphics board in some embodiments. Similarly, the array of pass-through contacts on the interposer may align with arrays of compressible communication contacts of the first or second compression jumper pads on the opposite side.

At 825, at least one side of the interposer is plated with a gold-component coating or a plating material that is otherwise a neutral metal material that will also enhance conductivity. In some embodiments as described, both sides may be plated such that the plating is applied to the array of pass-through contacts such that compressible communication contacts may make electrical contact with either side of the interposer.

It is understood that in some embodiments, the interposer is previously manufactured and previously plated in bulk amounts. The previously manufactured interposers may be selected from a plurality of them adhesively attached to a tape reel or supplied in a bulk stack or other organization for easy selection. A pick-and-place machine may be used in some embodiments. In this way, the cost and efficiency of using the interposer may be drastically reduced compared to plating either the motherboard or the graphics board.

Proceeding to 830, one side of the interposer has solder applied. In one embodiment, balls of solder may be automatically applied to each pass-through electrical contact on the bottom or solder side of the interposer. In another embodiment, an array of solder balls may be applied to the connection pad interfaces of the motherboard or graphics board instead of the interposer. In some embodiments, solder paste may be applied via stencil or other means to the pass-through electrical contacts on the bottom or solder side of the interposer according to some embodiments. This may be done according to PCB manufacture and assembly methods. Further, in yet another embodiment, solder paste may be applied to the array of electrical contacts at the connection pad interfaces of the motherboard or the graphics board rather than the interposer. Once the solder material has been applied to either the interposer or the connection pad interface areas, the interposer may be aligned with the connection pad interfaces. For example, a pick-and-place machine may be used to select pre-plated interposers provided on an adhesive reel, or in another bulk organization structure such as a stack or tray. The pick-and-place machine may place the interposers in alignment over the connection pad interface requiring an interposer in some embodiments. This is substantially more efficient than plating the connection pad interface areas of a graphics board or motherboard. Other soldering techniques or methods may also be used as understood by those of skill in place of the specific examples described above.

At 835, heat may be applied to the localized connection pad interface areas of the motherboard or graphics board, or heat may be applied to the motherboard and graphics boards generally. Once heated, the mechanical and electrical bond may be established to affix the pass-through electrical contacts of the interposer with corresponding plurality of electrical contacts of each connection pad interface of the motherboard or graphics board. Application of heat to the soldered areas of the motherboard or graphics board may be conducted by a variety of means as understood.

At 840, in aligning the motherboard and graphics board, the connector pad interface areas of the motherboard and graphics board may be aligned along adjacent edges. This is done in view of where the motherboard and graphics board are ultimately mounted in the chassis of an information handling system. Next, one or more flexible compression jumper connectors are selected. A first compression jumper pad of the flexible compression jumper connector may be aligned over an interposer affixed to the motherboard. A second compression jumper pad of the flexible compression jumper connector may be aligned over an interposer affixed to the graphics board. Alignment may be made by utilizing alignment guides on the first and second jumper pads corresponding with alignment guide structures on the interposers affixed to the motherboard and graphics board. For example, the first and second compression jumper pads may have alignment guide posts extending from the bottom of the compression jumper pads in an embodiment. Those alignment guide posts may fit into alignment guide receiving holes in the interposer plates. In some embodiments, it may be at this point that the angle or curve, if any, of the adjustable transition provided by the flexible jumper trace array between the first and second compression jumper pads of the flexible compression jumper connectors may be set to allow for any difference in height between the PCB boards of the motherboard and graphics board. The adjustable transition permits desired alignment of the two PCB boards such that the PCB boards may be used in a variety of information handling system model designs as described for various embodiments herein.

Proceeding to 845, compression screws or another clamping system may be employed to compress the first compression jumper pads of the flexible compression jumper connector to the interposer plate that is affixed to the connection pad interface on the motherboard. Similarly, compression screws or another clamping system may compress a second compression jumper pad to the interposer plate affixed to the graphics board as described below. In an example embodiment starting with the motherboard, compression screws may be disposed through holes in the first compression jumper pads to receivers mounted on, in, or below the interposer plate or on, in, or below the motherboard. The compression screw receivers may be a compression screw nut into which the compression screws may be tightened to compress the first compression jumper pads to the interposers. As a compression screw or other clamping system is tightened, the array of compression spring contacts on the first compression jumper pad may be compressed into the plated, pass-through electrical contacts of the interposer affixed to the connector pad interface of the motherboard.

Turning to the graphics board, compression screws or another clamping system may compress the second jumper pads of the flexible compression jumper connector to the interposer plate affixed to the connection pad interface on the graphics board. In an example embodiment, compression screws may be disposed through holes in the second compression jumper pads to receivers mounted on, in, or below the interposer plate or on, in, or below the graphics board. The compression screw receivers may be a compression screw nut into which the compression screws may be tightened to compress the first compression jumper pads to the interposers. As a compression screw or other clamping system is tightened, the array of compression spring contacts on the second compression jumper pad may be compressed into the plated, pass-through electrical contacts of the interposer affixed to the connector pad interface of the graphics board.

The above process may be used repeatedly to clamp a plurality of flexible compression jumper connector between each motherboard and graphics board pair as an assembly design calls for. Use of at least one plated side of the interposer may establish an electrical contact for each active motherboard electrical contact via the interposer while avoiding a chemical conflict between the metal alloy of the compression spring contacts and OSP or other anti-tarnish coating on the motherboard PCB. The interposer further avoids need for complicated techniques to plate the motherboard. The established electrical contacts may be used to communicate digital display data across a trace of the flexible compression jumper connector between the motherboard and the graphics board. It is understood that other clamping mechanisms may be used including a c-clamp, a clip, a cinchable band, a tie, or other mechanism to compress the first compression jumper pads to the mounted pad array of compression spring contacts may be used.

It is understood that the structures and concepts described in the embodiments above for FIGS. 1-4 and 7 may be constructed using a variety of the components. For example, the compressible spring contact structure may be any of or a combination of deflectable wires, springs, strips, or other structures understood in the art to apply a counter force when compressed to make mechanical and electrical contact with a corresponding electrical contact compressed into the compressible spring contact. It is also understood that for the methods in FIGS. 5, 6, and 8 some steps may be omitted, additional steps may be performed, or steps may not be performed in the order depicted according to variations of the embodiments as understood by those of skill. In particular, for embodiments of the figures disclosed herein, some varied embodiments may utilize certain components or techniques which may also be combined with portions of any other embodiments in the present disclosure to form a variety of additional embodiments from aspects of those embodiments described herein.

In some embodiments, dedicated hardware implementations such as application specific integrated circuits, programmable logic arrays and other hardware devices can be constructed to implement one or more of the internal components described herein or portions of one or more of the internal components described herein. Applications that may include the apparatus and systems of various embodiments can broadly include a variety of electronic and computer systems. One or more embodiments described herein may implement functions using two or more specific interconnected hardware structures to provide a simplified access to internal components of a mobile information handling system while maintaining a unibody appearance between the display screen and the chassis.

In accordance with various embodiments of the present disclosure, the compressive force structures described are understood by those of skill in the art to be a structure when placed between to objects and subject to compressive stress responds with a counterforce against that compressive stress. Example specific structures such as compressive pads, foam, springs, bladders, or shape memory devices that return to an original shape after stress of compression is release and described herein may be implemented by numerous embodiments described.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The device or module can include software, including firmware embedded at a device, such as an Intel® Core™ or ARM® RISC brand processors, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries. Further, devices, structures or other aspects of the mobile information handling systems described or shown as coupled or connected to one another or applying force to one another may be connected or coupled in all cases through one or more additional intermediary structures or devices or some structures and devices may not be needed or intermediary as shown or described. Several example embodiments are described where such a coupling or connection of structures may exist.

Although only a few exemplary embodiments have been described in detail herein, those skilled in the art will appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
   a chassis supporting a motherboard having a processor and a graphics board including a graphics processor, wherein the motherboard and the graphics board are coated with an anti-tarnish material;
   a first interposer soldered to a connector pad area of the motherboard, wherein the first interposer has at least one side plated with a neutral metal material;
   a flexible compression jumper connector having a first compression jumper pad with a first array of compressible communication contacts operatively coupled to the first interposer;
   a first fastener to compress the first array of compressible communication contacts to a plurality of pass-through electrical contacts on the first interposer; and
   the flexible compression jumper connector having a flexible jumper trace array cable between the first compression jumper pad and a second compression jumper pad operatively coupled to the graphics board such that the motherboard and the graphics board are operatively coupled with lanes of data communication between the processor and the graphics processor, wherein the flexible jumper trace array cable may be adjusted to align the motherboard adjacent to the graphics board to reduce thickness of the information handling system.

2. The system of claim 1, further comprising:
   a second interposer soldered to a connector pad area of the graphics board, wherein the second interposer has at least one side plated with a neutral metal material;
   the second compression jumper pad with a second array of compressible communication contacts operatively coupled to the connector pad area of the graphics board via the second interposer; and
   a second fastener to compress the second array of compressible communication contacts to the plurality of pass-through electrical contacts on the second interposer.

3. The system of claim 2, wherein the first fastener and the second fastener are compression screws disposed through the first compression jumper pad and the second compression jumper pad respectively.

4. The system of claim 1, wherein the first array of compressible communication contacts is an array of electrical spring contacts making electrical contact when compressed to the first interposer.

5. The system of claim 1, wherein the first connector pad interface area with a plurality of electrical contacts on the motherboard includes an array of electrical contacts on the motherboard corresponding to the plurality of pass-through electrical contacts on the first interposer which correspond to the first array of compressible communication contacts of the first compression jumper pad.

6. The system of claim 1, wherein the least one side of the first interposer is plated with the neutral metal that includes electroless nickel immersion gold (ENIG).

7. A method of operatively coupling a motherboard and a graphics board in an information handling system comprising:
   supporting the motherboard including a central processor and the graphics board including a graphics processor on a chassis, wherein the motherboard and the graphics board are coated with an anti-tarnish finish;
   plating a first interposer on at least a first side with a neutral metal material;
   soldering a first plurality of pass-through electrical contacts of the first interposer to a connector pad area of the motherboard;
   aligning a first compression jumper pad of a flexible compression jumper connector with the first plurality of pass-through electrical contacts on the plated first side of the first interposer;
   clamping the first compression jumper pad with a first fastener to compress an array of compressible communication contacts on the first compression jumper pad to the first plurality of pass-through electrical contacts on the first interposer;
   adjusting a flexible jumper trace array cable between the first compression jumper pad and a second compression jumper pad of the flexible compression jumper connector to adjacently align the motherboard and graphics board to minimize thickness of the information handling system; and
   operatively coupled the second compression jumper pad of the flexible compression jumper connector to the graphics board, via a second fastener, to provide lanes of data communication between the central processor and the graphics processor.

8. The method of claim 7, further comprising:
   setting the relative height of the graphics board adjacent to the motherboard such that a top of the central processor and a top of the graphics processor align in height relative to the bottom of the chassis; and
   operatively couple a planar heat pipe to the top of the central processor and the top of the graphics processor.

9. The method of claim 7, wherein soldering the first interposer to a connector pad area of the motherboard further comprises applying solder paste to the first plurality of pass-through electrical contacts on a second side of the first interposer, aligning the second side of the first interposer with the connector pad interface area of the motherboard, and applying heat to affix the solder between the second side of the first interposer and the motherboard.

10. The method of claim 7, wherein clamping the first compression jumper pad to compress an array of compressible communication contacts to the first plurality of pass-through electrical contacts on the first interposer includes disposing the first fastener comprising a compression screw through the first compression jumper pad of the flexible compression jumper connector and into a compression screw nut disposed below the first interposer.

11. The method of claim 7, further comprising:
soldering a second interposer to a connector pad area of the graphics board, wherein the second interposer is plated with a neutral metal material on a side opposite of the solder;
clamping the second compression jumper pad to compress a second array of compressible communication contacts to a second plurality of pass-through electrical contacts on the second interposer plated with the neutral metal material.

12. An information handling system comprising:
a chassis supporting a motherboard having a processor and a graphics board including a graphics processor, wherein the motherboard and the graphics board are coated with an anti-tarnish material;
a first interposer soldered to a connector pad area of the motherboard, wherein the first interposer has at least one side plated with a neutral metal material;
a flexible compression jumper connector having a first compression jumper pad with a first array of compressible communication contacts operatively coupled to the first interposer;
a first fastener to compress the first array of compressible communication contacts to a plurality of pass-through electrical contacts on the first interposer;
a second fastener to compress a second array of compressible communication contacts of a second compression jumper pad to a connector pad area of the graphics board; and
the flexible compression jumper connector having a flexible jumper trace array cable between the first compression jumper pad and the second compression jumper pad operatively coupled to the graphics board such that the motherboard and the graphics board are operatively coupled with lanes of data communication between the processor and the graphics processor, wherein the flexible jumper trace array cable may be adjusted to align the motherboard adjacent to the graphics board to reduce thickness of the information handling system.

13. The system of claim 12, further comprising:
a second interposer soldered to the connector pad area of the graphics board, wherein the second interposer has at least one side plated with a neutral metal material.

14. The system of claim 12, further comprising:
the second compression jumper pad with a second array of compressible communication contacts operatively coupled to the connector pad area of the graphics board via a second interposer.

15. The system of claim 12, further comprising:
the second fastener to compress the second array of compressible communication contacts to a plurality of pass-through electrical contacts on a second interposer.

16. The system of claim 12, wherein the first array of compressible communication contacts is an array of electrical spring contacts making electrical contact when compressed to the first interposer.

17. The system of claim 12, wherein the first connector pad interface area with a plurality of electrical contacts on the motherboard includes an array of electrical contacts on the motherboard corresponding to the plurality of pass-through electrical contacts on the first interposer which correspond to the first array of compressible communication contacts of the first compression jumper pad.

18. The system of claim 12, wherein the least one side of the first interposer is plated with the neutral metal that includes electroless nickel immersion gold (ENIG).

19. The system of claim 12, wherein the first fastener and the second fastener are compression screws disposed through the first compression jumper pad and the second compression jumper pad respectively.

20. The system of claim 12, further comprising:
a compression screw receiver mounted in the motherboard beneath the first interposer for receiving a compression screw.

* * * * *